United States Patent
Kasuya et al.

(10) Patent No.: US 10,522,319 B2
(45) Date of Patent: Dec. 31, 2019

(54) ELECTRON BEAM APPARATUS

(71) Applicant: Hitachi High-Technologies Corporation, Minato-ku, Tokyo (JP)

(72) Inventors: Keigo Kasuya, Tokyo (JP); Noriaki Arai, Tokyo (JP); Toshiaki Kusunoki, Tokyo (JP); Takashi Ohshima, Tokyo (JP); Tomihiro Hashizume, Tokyo (JP); Yusuke Sakai, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/338,006

(22) PCT Filed: Oct. 13, 2016

(86) PCT No.: PCT/JP2016/080357
§ 371 (c)(1),
(2) Date: Mar. 29, 2019

(87) PCT Pub. No.: WO2018/070010
PCT Pub. Date: Apr. 19, 2018

(65) Prior Publication Data
US 2019/0237289 A1  Aug. 1, 2019

(51) Int. Cl.
*H01J 37/073* (2006.01)
*H01J 9/02* (2006.01)
*H01J 37/28* (2006.01)

(52) U.S. Cl.
CPC .......... *H01J 37/073* (2013.01); *H01J 9/025* (2013.01); *H01J 37/28* (2013.01);
(Continued)

(58) Field of Classification Search
CPC .......... H01J 37/073; H01J 9/025; H01J 37/28; H01J 2237/2809; H01J 2237/06341; H01J 2209/0226; H01J 9/02; H01J 1/30
See application file for complete search history.

(56) References Cited

U.S. PATENT DOCUMENTS

| 2007/0148991 A1* | 6/2007 | Schwind | H01J 1/304 |
| | | | 438/800 |
| 2008/0315089 A1* | 12/2008 | Yasuda | H01J 37/073 |
| | | | 250/306 |

(Continued)

FOREIGN PATENT DOCUMENTS

| JP | 3-274642 A | 12/1991 |
| JP | 10-31955 A | 2/1998 |
| WO | WO 2014/007121 A1 | 1/2014 |

OTHER PUBLICATIONS

International Search Report (PCT/ISA/210) issued in PCT Application No. PCT/JP2016/080357 dated Jan. 17, 2017 with English translation (five (5) pages).
(Continued)

*Primary Examiner* — Kevin Quarterman
(74) *Attorney, Agent, or Firm* — Crowell & Moring LLP

(57) ABSTRACT

An electron beam apparatus which can stably achieve high spatial resolution also during low acceleration observation using $CeB_6$ for the CFE electron source is provided. In an electron beam apparatus having a CFE electron source, the emitter of the electron beam of the CFE electron source is Ce hexaboride or a hexaboride of a lanthanoid metal heavier than Ce, the hexaboride emits the electron beam from the {310} plane, and the number of the atoms of the lanthanoid metal on the {310} plane is larger than the number of boron molecules comprising six boron atoms on the {310} plane.

15 Claims, 15 Drawing Sheets

(52) U.S. Cl.
CPC ............... *H01J 2209/0226* (2013.01); *H01J 2237/06341* (2013.01); *H01J 2237/2809* (2013.01)

(56) References Cited

U.S. PATENT DOCUMENTS

| | | | |
|---|---|---|---|
| 2010/0028235 A1* | 2/2010 | Qin .................. | B82Y 30/00 423/263 |
| 2010/0320942 A1* | 12/2010 | Hayn ................ | H01J 37/063 315/379 |
| 2015/0002009 A1 | 1/2015 | Zhang et al. | |
| 2015/0357146 A1* | 12/2015 | Saito ................ | H01J 9/025 250/492.3 |

OTHER PUBLICATIONS

Japanese-language Written Opinion (PCT/ISA/237) issued in PCT Application No. PCT/JP2016/080357 dated Jan. 17, 2017 (three (3) pages).

Futamoto, a doctor's thesis submitted to Osaka University, Chapter 5, pp. 66-71, 1981 with English translation.

* cited by examiner

[Fig. 1]
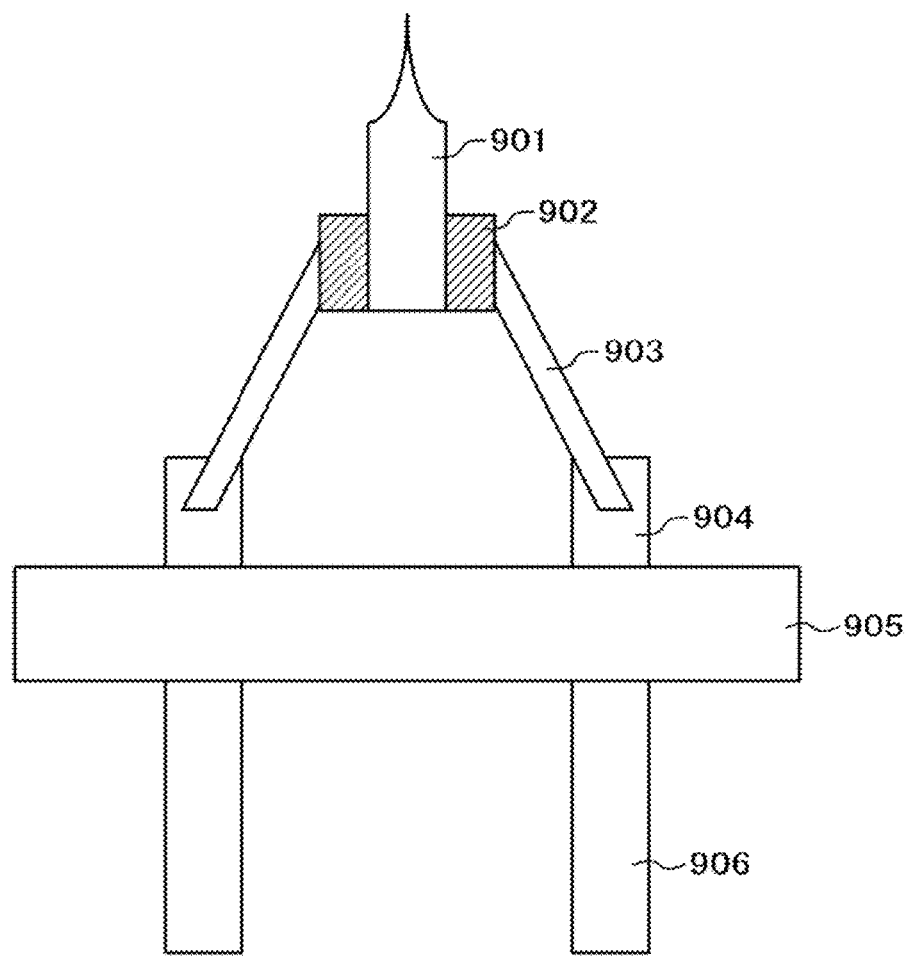

[Fig. 2]
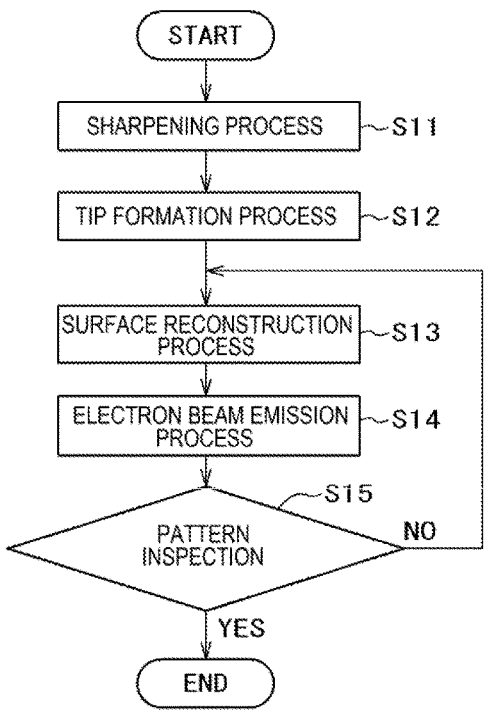
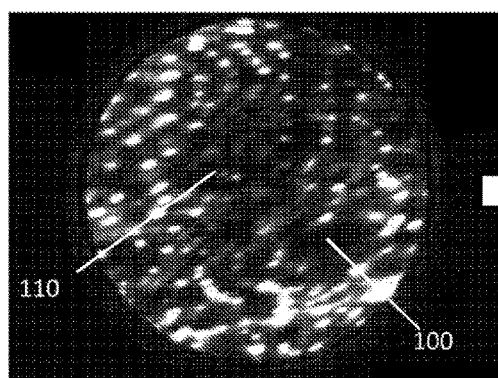
FIG. 3A
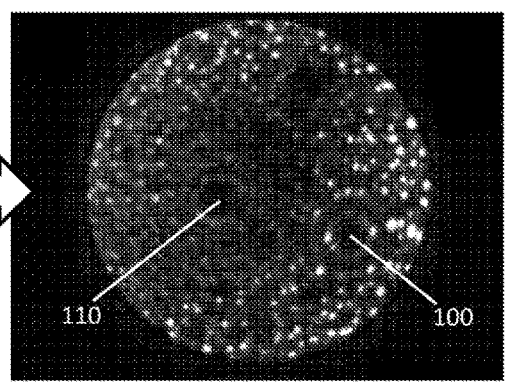
FIG. 3B

[Fig. 4]
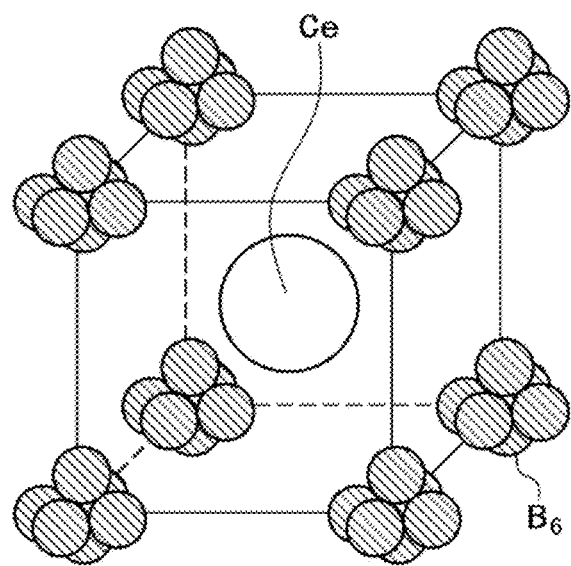

[Fig. 5]
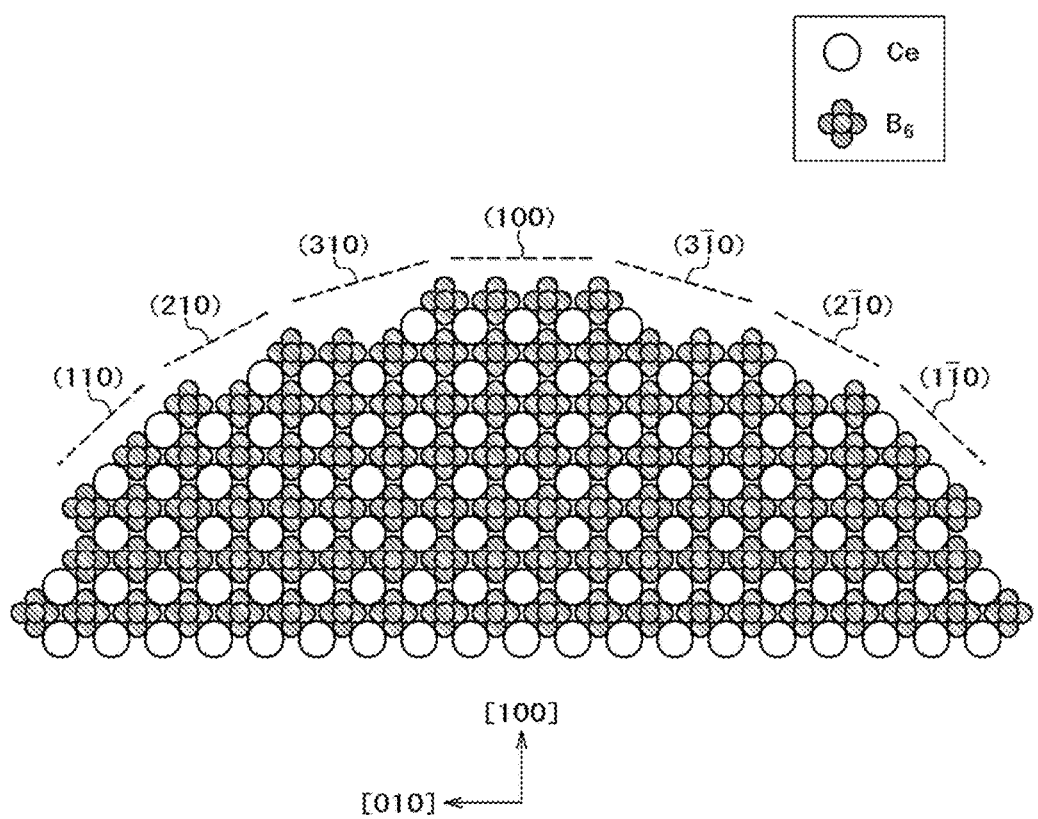

[Fig. 7]
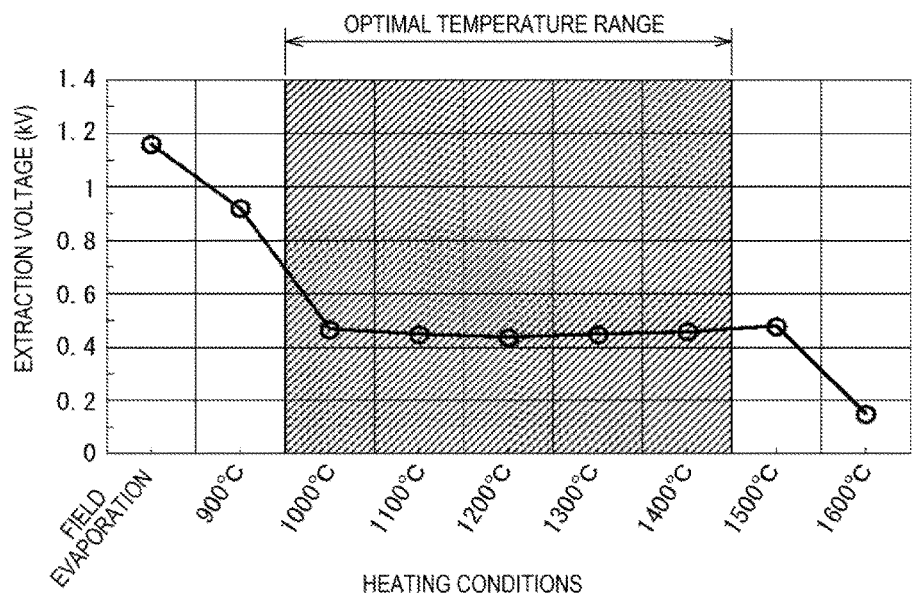
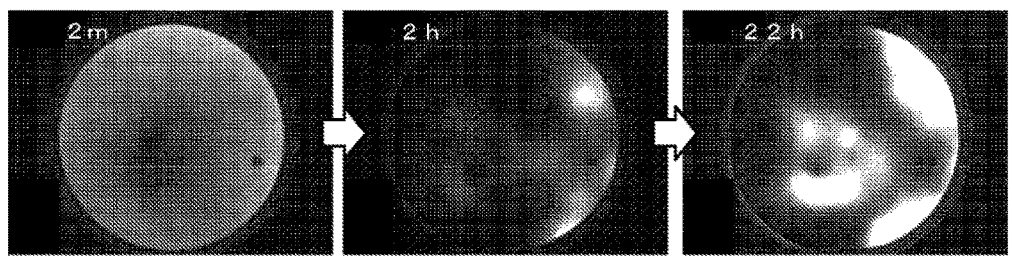
FIG. 8A  FIG. 8B  FIG. 8C

FIG. 9A
FIG. 9B
FIM 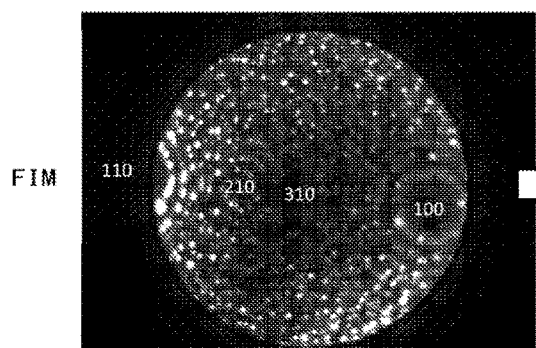 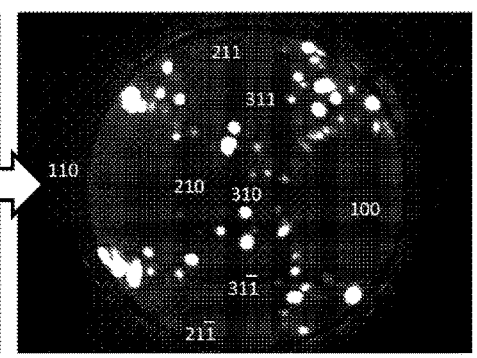
FIG. 9C
FIG. 9D
FEM 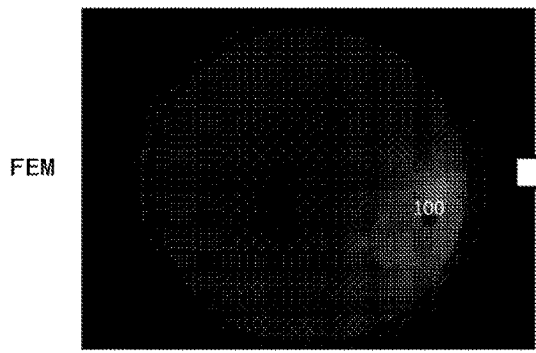 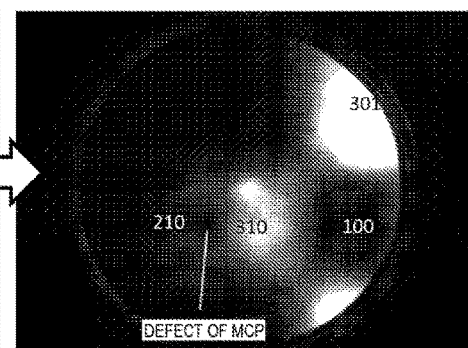

[Fig. 10]
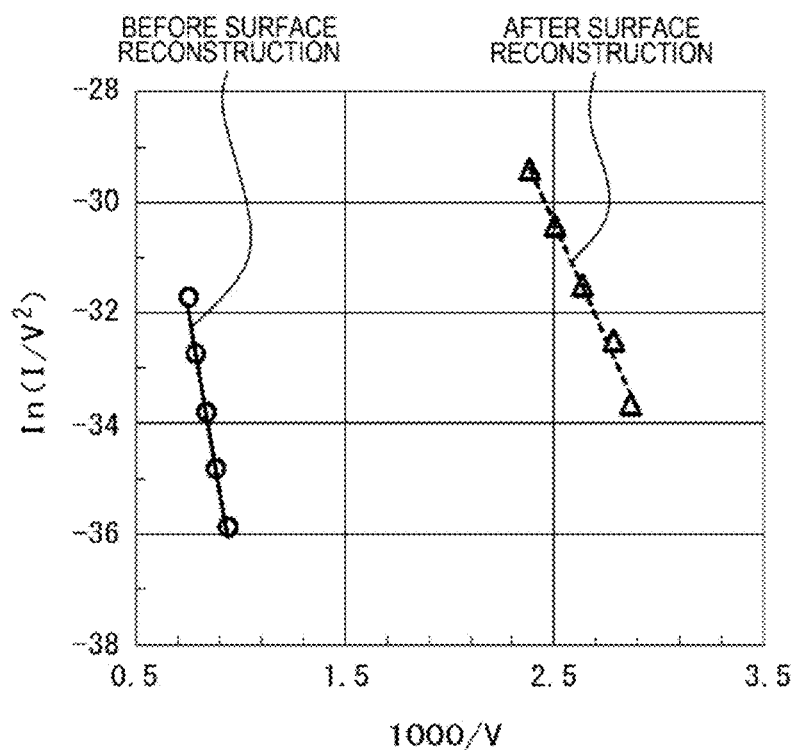
[Fig. 11A]
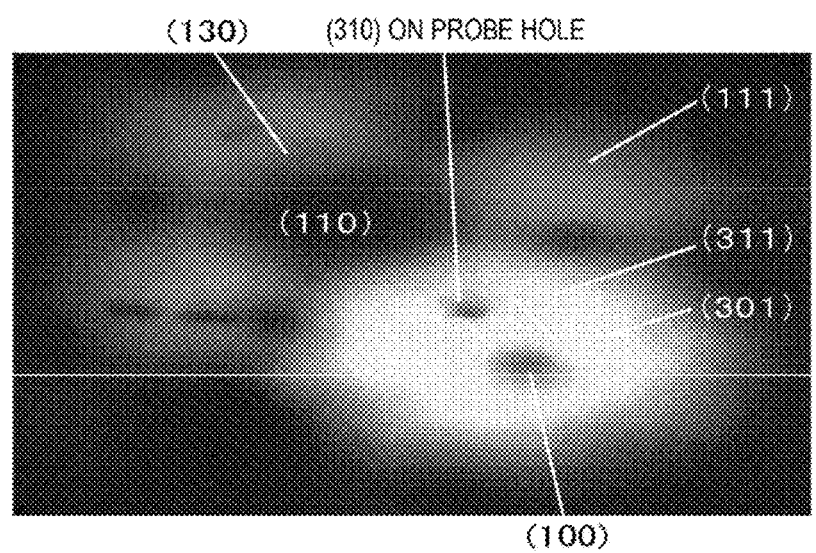

[Fig. 11B]
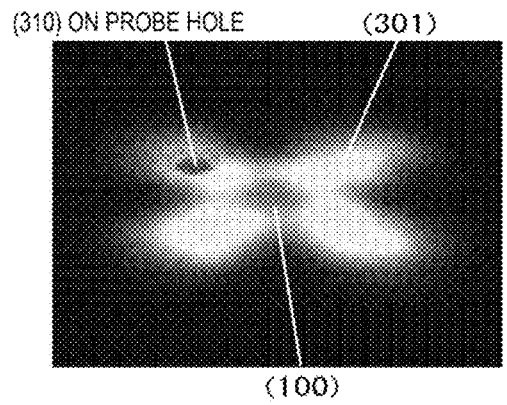
[Fig. 12]
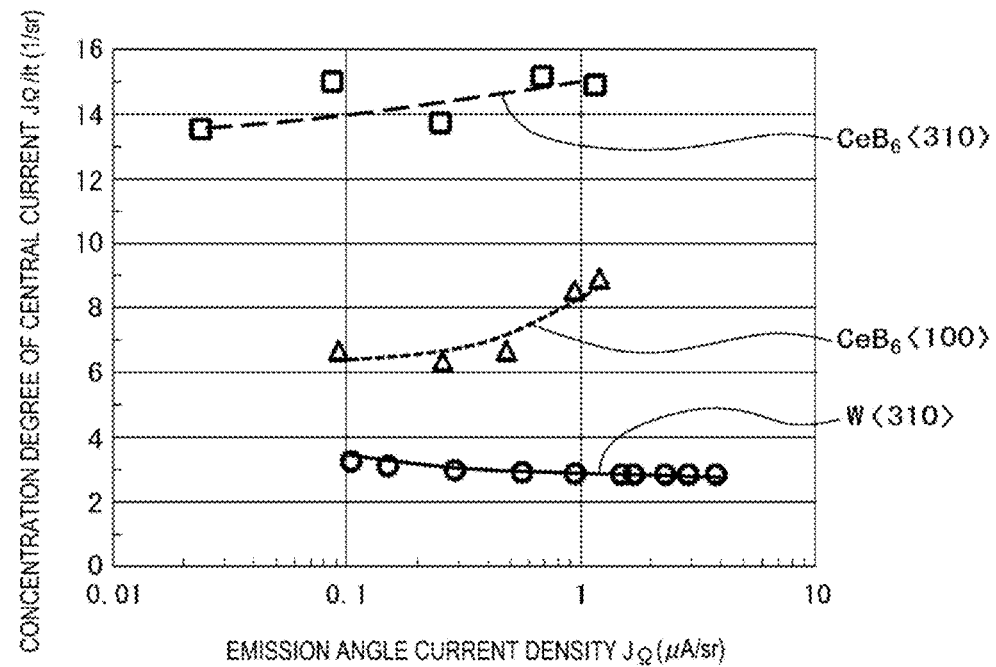

[Fig. 13]
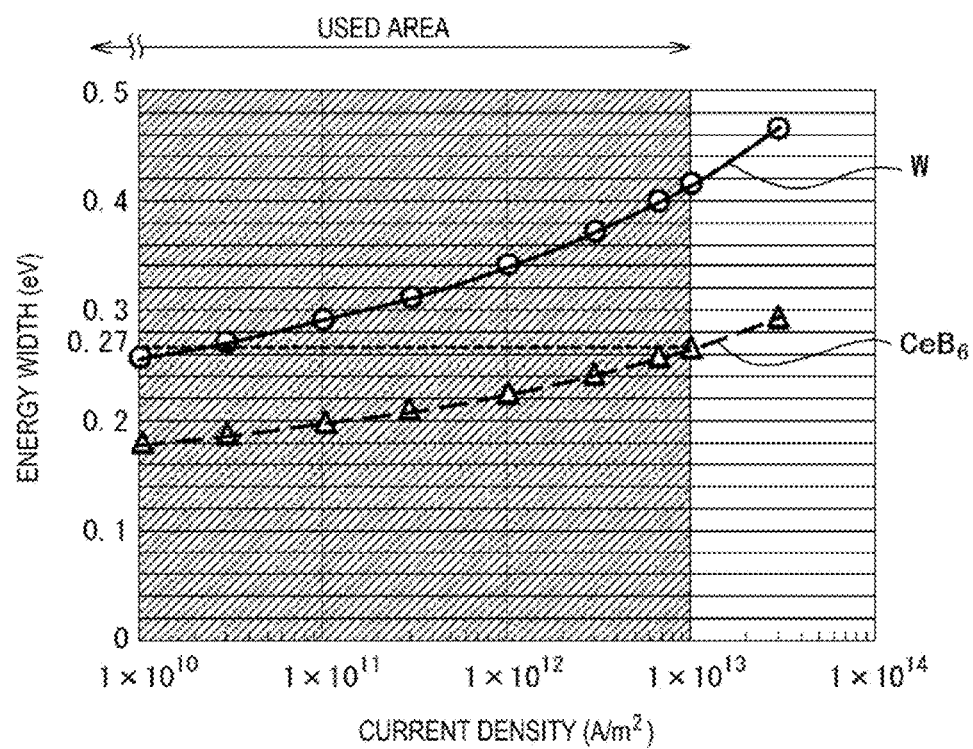

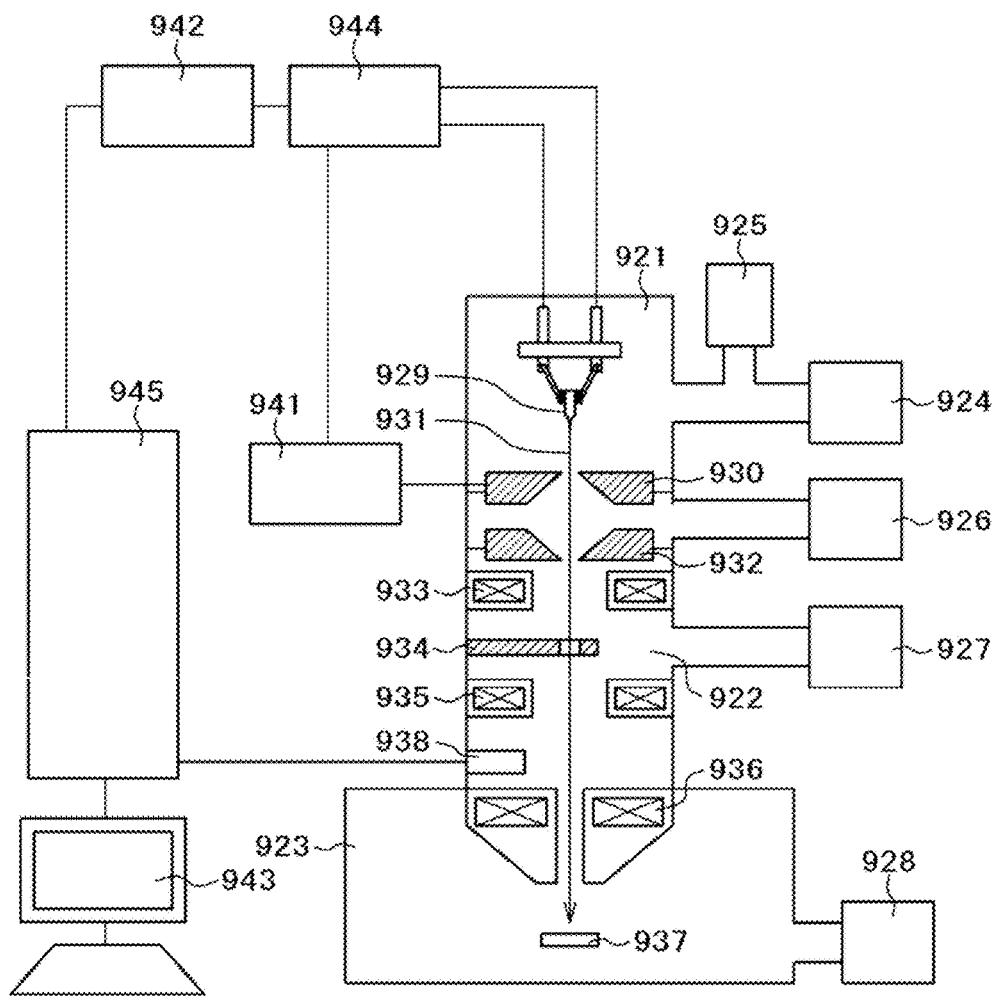
[Fig. 14]

[Fig. 15]
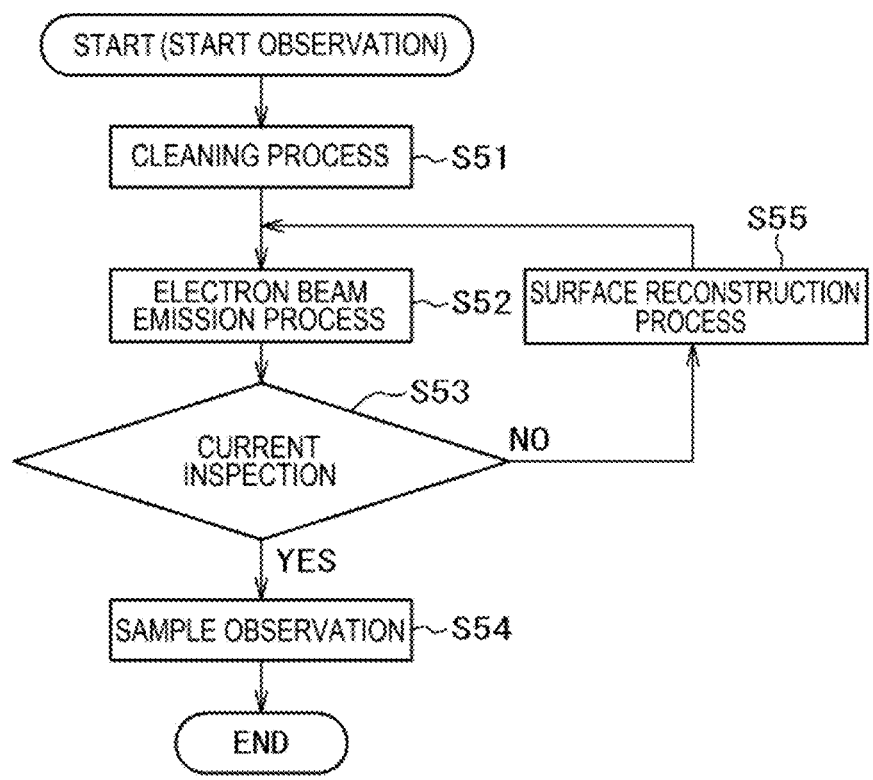

[Fig. 17]
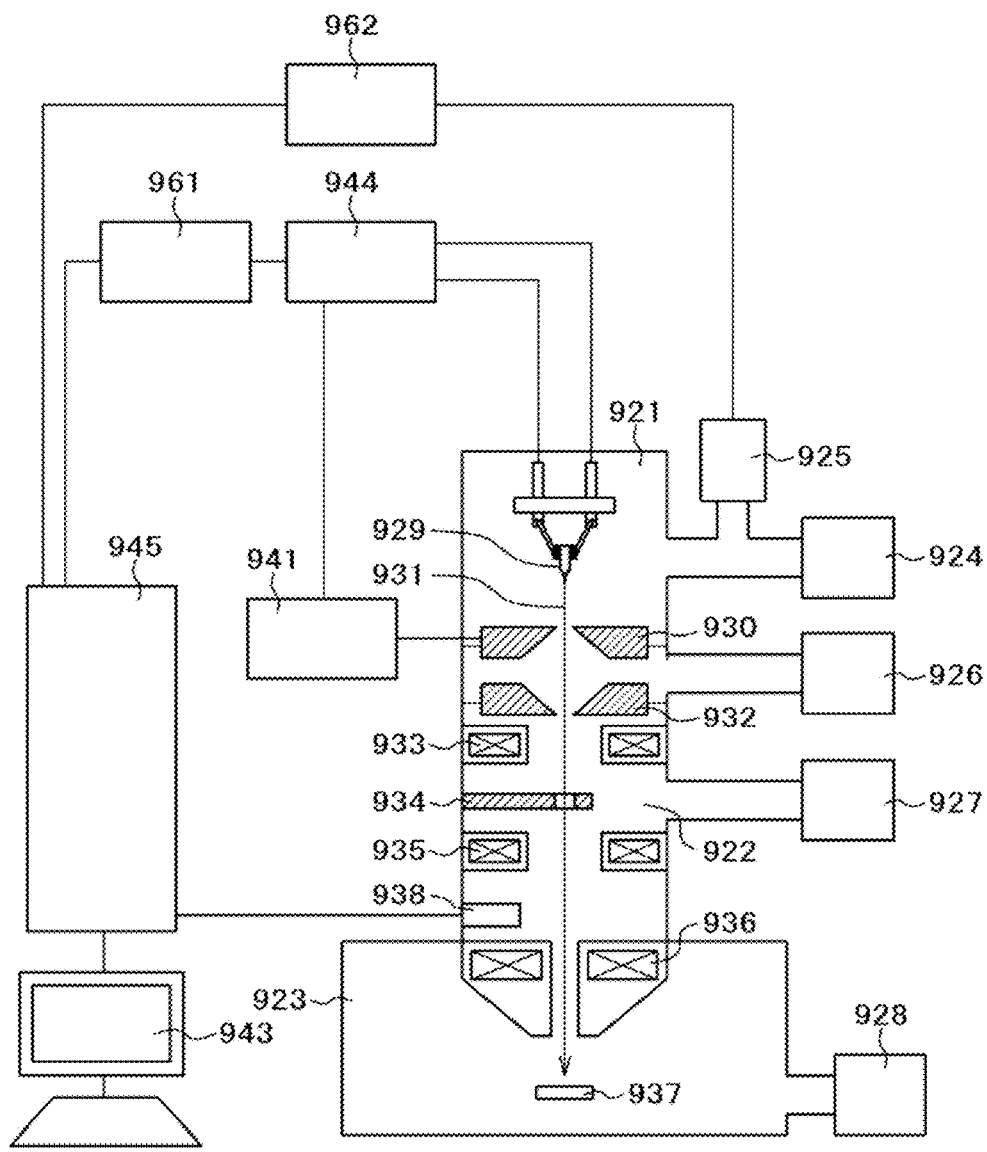

[Fig. 18]
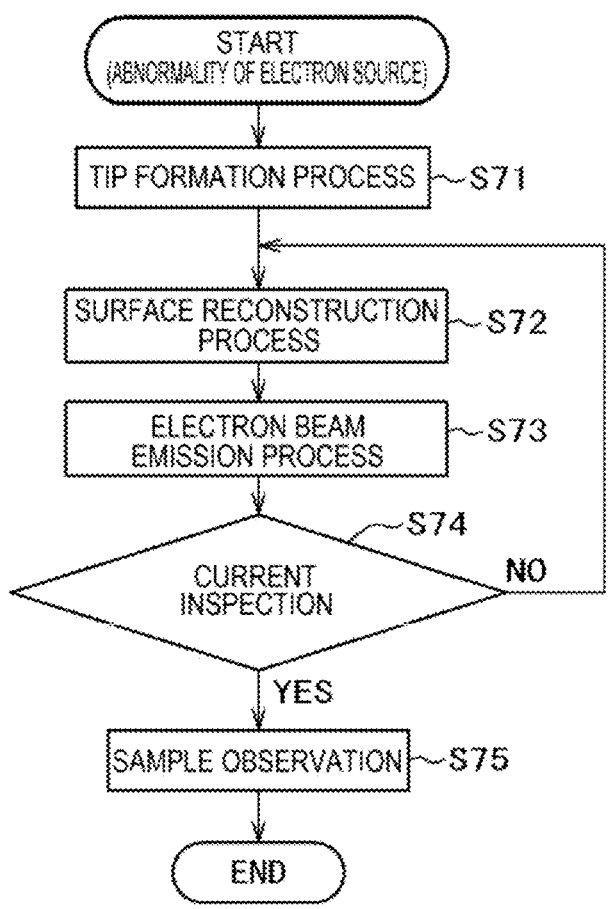

ELECTRON BEAM APPARATUS

TECHNICAL FIELD

The present invention relates to an electron beam apparatus.

BACKGROUND ART

Electron microscopes have spatial resolution exceeding the optical limit and enable observation of fine structures on the order of nm to pm and analysis of compositions. Thus, electron microscopes are widely used in the fields of engineering such as materials, physics, medical science, biology, electricity and mechanics. A type of electron microscope with which a sample surface can be easily observed is a scanning electron microscope (SEM). Recently, it is desired that SEMs enable observation of the top surface of a sample or observation of a light element substance such as carbon-based compounds. Such observation can be achieved by "low acceleration observation" in which the energy of the electron beam that reaches the sample is reduced to around 5 keV or less. However, the spatial resolution during low acceleration observation has a problem because the spatial resolution deteriorates due to the chromatic aberration of the objective lens. The chromatic aberration can be reduced by reducing the variation in the energy of the electron beam. Thus, in order to achieve high resolution also for low acceleration observation, it is required to reduce the variation in the energy of the electron beam, that is, a monochromatic electron beam is necessary.

The monochromaticity of an electron beam is determined by the properties of the electron source that emits the electron beam. Thus, by selecting the optimal electron source, the resolution during low acceleration observation can be increased. There are mainly three kinds of electron source that are currently used in practical applications, and the three are thermionic electron sources, cold field emission (CFE) electron sources and Schottky electron sources.

Thermionic electron sources are electron sources which emit thermoelectrons by continuously heating filaments made of tungsten (called W below) to around 2500° C. When W is heated, the energy of electrons in W becomes higher than the Fermi level. The energy of some electrons exceeds the work function, and the electrons are emitted into the vacuum. The variation in the energy of an electron beam is represented by the full width at half maximum of the energy distribution (called an energy width below). The energy width of a thermionic electron source is around 3 eV to 4 eV, which is the greatest among the three types of electron sources, and it is difficult to achieve high resolution during low acceleration observation with this kind of electron source.

Reasons why the energy width of the electron beam emitted from a thermionic electron source is great are that electrons have a variation corresponding to the thermal energy when the electrons are heated and that the electrons with the variation are directly emitted. As the heating temperature increases, the energy width becomes greater. Thus, a thermionic electron source in which the heating temperature is decreased using a material other than W and a thermionic electron source which has an electron emitter with a tip narrowed to the order of μm have been put into practice. However, the energy widths of both sources are still great and are around 2 eV or more.

The principal of electron emission from CFE electron sources is different from that from thermionic electron sources, and CFE electron sources are electron sources which emit electrons through the quantum tunneling effect. When an extraction voltage is applied using a W needle with a sharpened tip as the negative electrode, the field concentrates at the tip, and electrons are emitted. This phenomenon is called field emission. The field at the tip is at minas several volts per nanometer. Through field emission, the electrons in W which have energy around the Fermi level mainly slip through the potential barrier and are emitted into the vacuum. The energy width of the electron beam emitted from a CFE electron source is narrow and is 0.3 eV to 0.4 eV, which is the narrowest among the three types of electron sources. In order to achieve high resolution during low acceleration observation, CFE electron sources are the optimal electron sources. When a CFE electron source is heated during its use, the number of electrons with energy higher than the Fermi level increases, and the energy width of the electron beam slightly increases. Thus, CFE electron sources are generally used at room temperature or at a lower temperature. This is why these sources are called cold sources.

The tip of the W needle of a CFE electron source is sharpened to a radius of curvature of around 50 nm to 150 nm to cause field concentration. The tip is very fine, and thus the surface of the tip has a structure of a combination of crystal faces. Moreover, the alignment of the crystal faces reflects the crystal structure and is regular and constant. Each crystal face has its own work function, and the work function is a value reflecting the crystal structure on the surface of the fine tip. As the work function reduces, the current released through field emission becomes higher. The stability and the brightness of an electron beam also differ with the crystal face. The electron beam emitted from the {310} plane with a work function of 4.3 eV and from the {111} plane with a work function of 4.5 eV is mainly used as probe current in W.

The shape of the tip, the sizes of the crystal faces and the work function vary with the material used for the electron source. Thus, the characteristics of the electron beam differ with the material, and the optimal electron-emitting face is also different. CFE electron sources made of various materials other than W have been studied so far, but none of them have been put into practice. For example, NPL 1 describes a CFE electron source using cerium hexaboride (called $CeB_6$ below), which is expected to achieve a small work function.

Like thermionic electron sources, Schottky electron sources emit thermoelectrons, but the surface with a decreased work function is characteristic of Schottky electron sources. A W <100> single crystal needle coated with ZrO is used for the electron sources, and the tip has a radius of curvature of around 0.5 μm to 1 μm, which is slightly larger than that of CFE electron sources. When this kind of electron source is continuously heated to 1400° C. to 1600° C., the ZrO coating specifically acts on the {100} plane and decreases the work function. Moreover, the Schottky effects are caused when a field is applied to the tip, and the effective work function further decreases. As a result, the work function of the {100} plane becomes around 2.8 eV. The energy width of the electron beam emitted from this plane is narrower than that of thermionic electron sources and is around 0.6 eV to 1 eV. This energy width is in the middle among the three types of electron sources. Schottky electron sources using a coating material other than ZrO are also studied, but most of them have not been put into practice.

CITATION LIST

Non Patent Literature

[NPL 1]
Masaaki Futamoto, a doctor's thesis submitted to Osaka University, Chapter 5, p 66-71, 1981

SUMMARY OF INVENTION

Technical Problem

By further improving the monochromaticity of a CFE electron source, the spatial resolution of an SEM during low acceleration observation can be further increased. According to the principal of field emission, as the work function of the electron-emitting face decreases, the energy width of the electron beam becomes narrower. Thus, when a CFE electron source is produced using a material with a small work function, the monochromaticity may be improved.

However, in addition to the properties of an electron source, the challenge for using an electron source in a practical application is the reproducibility of the electron beam, which means that the electron beam should be emitted repeatedly from a specific crystal face and that the characteristics of the electron beam such as the emission current and the energy width should be in certain ranges every time.

In order to obtain an electron beam with good reproducibility with a CFE electron source, it is necessary to control the surface of the electron source at the atomic level. An electron beam obtained through field emission is largely affected by the work function of the surface of the electron source and the degree of field concentration. The work function is determined by the material and the crystal orientation of the electron source. When residual gas in the vacuum is adsorbed, however, the electric dipoles on the surface change, and the work function also changes. Thus, a cleaning method for removing the adsorbed gas is required. The degree of field concentration is determined by the atomic structure of the surface, and the field concentrates on a sharper part. However, residual gas that has been ionized by the electron beam collides with the surface and causes sputtering, and the atomic structure changes. Thus, a method for repairing the atomic structure is required.

When these methods are not conducted, the emission current and the energy width of the electron beam change with time, and the observation images of the electron microscope change. Moreover, defects such as sudden cutoff of the electron beam or breakage of the electron source due to excessive emission of the electron beam are developed.

The surface control method for obtaining an electron beam with good reproducibility differs with the material used for the CFE electron source. In the conventional CFE electron source using W, through flashing for heating W at about 2000° C. or higher for an instant, the surface can be controlled. Adsorbed gas desorbs due to the thermal energy by flashing. Moreover, because the surface turns into semi-molten state, the atomic structure of the surface is repaired. As a result, the surface returns to the initial state after each flashing, and an electron beam with good reproducibility can be obtained.

On the other hand, the surface control method for cases using a material other than W has not been established yet and has not been put into practice. NPL 1 describes a method for emitting an electron beam from a CFE electron source using $CeB_6$ in which a $CeB_6$<100> single crystal produced by the aluminum flux method is heated in the vacuum at a temperature in the range of 1400° C. to 1500° C.

However, the work function of the surface or the characteristics of the electron beam are not disclosed. As a result of investigation of the inventors, it was found that a problem that is not described in other documents is the insufficient reproducibility of the electron beam. In addition to cleaning and repairing of the surface, a possible cause is that the kind of atoms exposed on the surface should be controlled. Unlike W, $CeB_6$ is a binary material. The work function decreases when Ce is exposed on the surface, while the work function increases when B is exposed. Thus, to obtain an electron beam with good reproducibility, the ratio of exposed Ce and B should be controlled. However, the control method has not been established, and it has been difficult to install a CFE electron source using $CeB_6$ to an SEM and to stably achieve high spatial resolution during low acceleration observation.

An object of the invention is to provide an electron beam apparatus which can stably achieve high spatial resolution also during low acceleration observation using $CeB_6$ for the CFE electron source.

Solution to Problem

An embodiment for achieving the object is an electron beam apparatus having a cold field emission electron source characterized in that: the emitter of the electron beam of the cold field emission electron source is Ce hexaboride or a hexaboride of a lanthanoid metal heavier than Ce; the hexaboride emits the electron beam from the {310} plane; and the number of the atoms of the lanthanoid metal on the {310} plane is larger than the number of boron molecules comprising six boron atoms on the {310} plane.

Another embodiment is an electron beam apparatus having a cold field emission electron source characterized in that the emitter of the electron beam of the cold field emission electron source is Ce hexaboride or a hexaboride of a lanthanoid metal heavier than Ce and that the full width at half maximum of the energy distribution of the electron beam emitted from a plane including the {310} plane of the hexaboride is 0.27 eV or less.

Another embodiment is an electron beam apparatus having a cold field emission electron source characterized in that the emitter of the electron beam of the cold field emission electron source is Ce hexaboride or a hexaboride of a lanthanoid metal heavier than Ce and that the ratio JΩ/It of the angular current density JΩ (μA/sr) of the electron beam emitted from a plane including the {310} plane of the hexaboride to the total current It (μA) emitted from the cold field emission electron source is six or more.

Advantageous Effects of Invention

According to the invention, an electron beam apparatus which can stably achieve high spatial resolution also during low acceleration observation using $CeB_6$ for the CFE electron source can be provided. Problems, structures and effects other than those described above are described by the explanation of the following embodiments.

BRIEF DESCRIPTION OF DRAWINGS

FIG. 1 is a side view of the $CeB_6$-CFE electron source installed in an electron beam apparatus according to the first Example of the invention.

FIG. 2 is a flowchart of the surface control process of the CeB$_6$-CFE electron source illustrated in FIG. 1.

FIGS. 3A and 3B are FIM images of the tip of a CeB$_6$-CFE electron source before and after the tip formation process (field evaporation) shown in FIG. 2: FIG. 3A is before field evaporation; and FIG. 3B is after field evaporation.

FIG. 4 is an oblique view of an atomic model showing the unit cell of CeB$_6$ used for the CFE electron source illustrated in FIG. 1.

FIG. 5 is an atomic model showing the vertical section of the tip of the CeB$_6$-CFE electron source illustrated in FIG. 1.

FIG. 6A is at 900° C.; FIG. 6B is at 1000° C.; FIG. 6C is at 1100° C.; (d) FIG. 6D is at 1200° C.; FIG. 6E is at 1300° C.; FIG. 6F is at 1400° C.; FIG. 6G is at 1500° C.; FIG. 6H is at 1600° C.; and FIG. 6I is a figure explaining the FEM pattern.

FIG. 7 is a graph showing the relation between the heating temperature and the extraction voltage required for obtaining a total current of 10 nA which were measured after heating field-evaporated CeB$_6$-CFE electron sources for two minutes at different temperatures.

FIGS. 8A to 8C are FEM images of a field-evaporated CeB$_6$-CFE electron source that was heated at a heating temperature of 800° C. for different periods: FIG. 8A is for 2 minutes; FIG. 8B is for 2 hours; and FIG. 8C is for 22 hours.

FIGS. 9A to 9D are FIM images and FEM images before and after the surface reconstruction process S13 shown in FIG. 2: FIG. 9A is an FIM image before S13; FIG. 9B is an FIM image after S13; FIG. 9C is an FEM image before S13; and FIG. 9D is an FEM image after S13.

FIG. 10 shows FN plots before and after the surface reconstruction process S13 shown in FIG. 2.

FIG. 11A shows results of measurement of an FEM image of a W-CFE electron source with a fluorescent screen.

FIG. 11B shows results of measurement of an FEM image of a CeB$_6$-CFE electron source with a fluorescent screen.

FIG. 12 shows results of comparison of the concentration degree of the electron beam among a W-CFE electron source and CeB$_6$-CFE electron sources.

FIG. 13 shows calculation results of the energy widths of the electron beams emitted from a W-CFE electron source and a CeB$_6$-CFE electron source.

FIG. 14 is a schematic sectional view showing the structure of an electron beam apparatus (SEM) having the CeB$_6$-CFE electron source according to the first Example of the invention.

FIG. 15 is a flowchart showing the observation procedures for a case using the SEM illustrated in FIG. 14.

FIG. 16A is before heating; FIG. 16B is at 800° C.; FIG. 16C is at 900° C.; and FIG. 16D is at 1000° C.

FIG. 17 is a schematic sectional view showing the structure of an electron beam apparatus (SEM) having the CeB$_6$-CFE electron source according to the second Example of the invention.

FIG. 18 is a flowchart showing the observation procedures including the process of reforming the electron-emitting face in the SEM for a case using the SEM illustrated in FIG. 17.

DESCRIPTION OF EMBODIMENTS

Figure 6A:
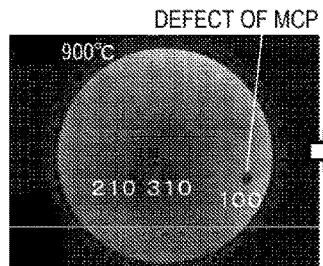
FIGS. 6A to 6I are measurement results of FEM images of field-evaporated CeB$_6$-CFE electron sources that were heated for two minutes at different temperatures.

Embodiments of the structure of the field emission electron source of the invention and the production method are explained below referring to the drawings. Although the Examples are explained using an SEM as an example, the invention is not limited to SEMs and can be applied to kinds of electron beam apparatus including transmission electron microscopes (TEMs), scanning transmission electron microscopes (STEMs), EB exposure equipment and the like. In the drawings below, the scales of the components are appropriately changed so that the structure of the invention can be understood easily. The crystal faces are indicated by the Miller indices, and a plane is denoted by ( ) A group of planes that are equivalent to the plane is denoted by { }. A crystal axis is denoted by [ ], and axes that are equivalent to the axis are denoted by < >.

Example 1

The structure of a CFE electron source using CeB$_6$ (called a CeB$_6$-CFE electron source below) is explained below using FIG. 1. FIG. 1 illustrates the CeB$_6$-CFE electron source installed in an SEM according to this Example. The parts of the electron source are explained below.

In the CeB$_6$-CFE electron source, a CeB$_6$<310> single crystal 901 is held by a holding unit 902, and the holding unit 902 is held by a heating unit 903. The ends of the heating unit 903 are connected to two heating electrodes 904. The heating electrodes 904 are held by an insulating unit 905. The two heating electrodes 904 are electrically connected to two pins 906.

For the CeB$_6$<310> single crystal 901, a small crystal obtained by cutting and fragmenting a large crystal grown by the float zone method or the like is used. Use of a crystal obtained by fragmenting a large crystal has an advantage because a large amount of high-purity crystals can be obtained at low costs. There are other advantages because the variation in the sizes of the crystals can be reduced and because there are no individual differences. When a crystal without impurities or defects is used, the reproducibility of the obtained electron beam improves.

With respect to the size of the large crystal, the diameter is several millimeters to several dozen millimeters, and the length is around several dozen millimeters. Regarding the size of the fragmented CeB$_6$<310> single crystal 901, the diameter is around 0.1 mm to 1 mm, and the length is around 1 mm to 5 mm. The CeB$_6$<310> single crystal 901 is not limited to a cylinder crystal but may have a pillar structure with a quadrilateral, polygonal or oval section or the like.

To enable field emission, the tip of the CeB$_6$<310> single crystal 901 is sharpened by electrolytic polishing. Electrolytic polishing can sharpen the tip of the crystal on the order of mm to the order of nm and thus has an advantage because a large number of CFE electron sources can be produced at low costs. The radius of curvature of the tip of the electron source after electrolytic polishing is 50 nm to 500 nm. By conducting the surface control of CeB$_6$ described below, the work function of the surface can be made small, and the extraction voltage required for field emission becomes low. Thus, even when the radius of curvature is larger than that of the conventional CFE electron source using W, sufficient field concentration can be achieved, and electrons can be emitted. When the radius of curvature becomes larger, the area emitting the electron beam becomes larger, resulting in a high current and a decrease in the energy width. Moreover, there are advantages because the Coulomb interaction among the electrons after electron emission becomes smaller and because an unnecessary increase in the energy width during the transport of the electron beam is less likely to be caused. To obtain the effects, the radius of curvature of the tip is desirably 300 nm to 500 nm.

The $CeB_6$<310> single crystal 901 is around 0.1 mm to 1 mm in size and thus can be installed to the electron source by human hand or using a machine. As a result, there is an advantage because a large number of electron sources can be produced at low costs. Moreover, in such a size, variations in the attached positions of the components, their sizes and the angles can be reduced when a special tool is used for the assembly. As a result, there is an advantage because the individual differences of the electron sources as a whole can be reduced.

It is also possible to use a nanowire having a diameter of around several dozen to several hundred nanometers for the $CeB_6$<310> single crystal 901. However, to form a crystal on the order of nanometer into an electron source, it is required to assemble the components using a manipulator under an electron microscope using a multifunctional device of a focused ion beam (FIB) and an SEM. This operation requires a longtime and increases the costs. Moreover, the individual differences of the crystals directly result in the individual differences of the electron sources, and a variation in the properties arises. Accordingly, a problem arises when the productivity is to be improved. In addition, when the radius of the tip is too small like a nanowire, there is also a problem because the emission current cannot be increased. On the other hand, there is an advantage because a nanowire can be used without cutting when an appropriate nanowire is selected.

Choosing <310> as the crystal axis is based on the findings of the inventors, and a reason is that an electron beam with excellent characteristics can be obtained from the {310} plane by the surface control method described below. In an electron source using a single crystal, a crystal face corresponding to the crystal axis appears in the center of the tip, and the electron beam emitted from this face travels on the axis. In an electron microscope, an electron beam on the axis is used as probe current and is applied to the sample using a lens or the like. It is thus appropriate to place the crystal face to be used on the axis in the center of the tip of the electron source. It is also possible to bend an electron beam emitted from off the axis with deflector and lead the electron beam to the axis. In this case, the structure of the electron microscope becomes complex, but an electron source having another crystal axis such as the <100> axis can be used, and an electron beam emitted from the {310} plane can be used.

Reasons for selecting $CeB_6$ for the electron-emitting source are that the work function is small and that the state density of the Fermi level is high. Ce has an electron in the 4f orbital. The energy level of an f electron is localized, and in the case of Ce, the f electron is positioned at the Fermi level and increases the state density. Because electrons near the Fermi level are emitted in field emission, as the state density of the level increases and is localized more, the energy width becomes narrower. Moreover, when the state density near the Fermi level is high, the change in the state density is relatively small even when gas is adsorbed on the surface. As a result, there is an advantage because the reproducibility of the electron beam becomes excellent.

Lanthanoids except for lanthanum (praseodymium, neodymium, promethium, samarium, europium, gadolinium, terbium, dysprosium, holmium, erbium, thulium, ytterbium and lutetium) have the 4f orbital, and thus a CFE electron source using such a material or a hexaboride thereof also has an advantage of the increased state density of the Fermi level like $CeB_6$ and is appropriate as a CFE electron source.

The holding unit 902 fixes the $CeB_6$<310> single crystal 901 and electrically connects to the crystal. A characteristic of $CeB_6$ is that $CeB_6$ chemically reacts with almost all the metals when heated, and thus a conductive substance with low reactivity with $CeB_6$, such as carbon, rhenium or tantalum, is used for the holding unit 902. A metal having a surface coated with such a material or a component composed of two or more of these materials in combination may also be used. Moreover, a material with high electric resistance can be used for the holding unit 902, and the holding unit 902 itself may be heated to a high temperature by letting a current flow.

The heating unit 903 fixes the holding unit 902 and heats the $CeB_6$<310> single crystal 901. A wire of W, tantalum or the like is used for the heating unit 903, and heating is conducted by letting a current flow. The surface reconstruction of the $CeB_6$ tip by heating is described below.

The ends of the heating unit 903 are fixed on the heating electrodes 904. The heating electrodes 904 are electrically connected to the pins 906 and are connected to an external heating power supply through the pins 906. By letting a current flow from the heating power supply, the heating unit 903 is heated.

The insulating unit 905 is a component that fixes the heating electrodes 904 and that electrically insulates the two heating electrodes 904 from each other. Moreover, by fixing the insulating unit 905 in the electron gun of the electron microscope, the whole electron source is held.

Using the electron source structure of FIG. 1 described above, a large number of high-purity $CeB_6$-CFE electron sources with small individual differences can be produced at low costs.

Next, a surface control process for obtaining an electron beam with good reproducibility from a $CeB_6$-CFE electron source is explained using FIG. 2 to FIG. 10.

FIG. 2 is a flowchart of a surface control process of a $CeB_6$-CFE electron source. When the $CeB_6$-CFE electron source of FIG. 1 is used in the state directly after electrolytic polishing, the electron-emitting face is not always the same, and the characteristics of the obtained electron beam change every time. Accordingly, it was found that an electron beam with good reproducibility cannot be obtained. An electron beam with good reproducibility can be obtained by conducting the surface control process shown in FIG. 2.

As shown in the flowchart of FIG. 2, the $CeB_6$<310> single crystal 901 described above is first electrolytically polished in a sharpening process S11, and the tip is sharpened to the order of nm. Next, in a tip formation process S12, the unevenness or the distortion on the surface of the electrolytically polished tip is removed, and the tip surface is formed into a globular shape at the atomic level. Then, in a surface reconstruction process S13, a facet structure is formed on the formed tip surface, and Ce is segregated on the {310} plane. Next, in an electron beam emission process S14, an electron beam is emitted from the electron source through field emission. Finally, in pattern inspection S15, the emission pattern of the emitted electron beam is inspected, and it is checked whether the desired pattern has been obtained. When the desired pattern could not be obtained, the surface reconstruction process S13 is additionally conducted until the desired pattern is obtained. Each process is explained below.

In the tip formation process S12, the tip of the electron source is formed into a globular shape by field evaporation.

Electrolytic polishing can sharpen the tip of a crystal on the order of mm to the order of nm and thus is a method suitable for producing a large number of electron sources. As a result of investigation of the inventors, however, it was found that the surface state of the polished tip is rough at the atomic level, resulting in problems of unevenness or distortion. W, which is the material of the conventional CFE electron source, has high surface tension, and thus when the tip is brought into semi-molten state by flashing, the tip turns into a globular shape by itself. As a result, the unevenness or the distortion of the tip surface is removed, and the tip can thus have a certain form.

On the other hand, $CeB_6$ is a material with low surface tension. Therefore, the tip does not become round even when heated, and $CeB_6$ sublimates while the unevenness or the distortion still remains. Through field emission from an electron source with such an uneven form, the point from which electrons are emitted depends on each electron source, and the characteristics of the electron beam also differ. Moreover, such an electron source is often damaged. Accordingly, a $CeB_6$-CFE electron source cannot be used by heating only.

Thus, field evaporation was conducted to remove the unevenness or the distortion of the $CeB_6$ tip, and it was found that an electron beam with good reproducibility was obtained. Therefore, a step of field evaporation is introduced to this process. Field evaporation is a method for ionizing the atoms on the tip surface and gradually stripping the atoms off by applying a positive field of plus several dozen volts per nanometer to the electron source. Field evaporation is caused more often at a point with a higher field intensity. Therefore, atoms in a sharp point on the surface or in a step part evaporate, and the whole surface can be evaporated when enough time is taken. When field evaporation proceeds sufficiently, the tip of the electron source turns into a globular shape in which the field intensity of the whole surface is even. This shape is called field evaporation end form.

Although field evaporation can be conducted also in the vacuum, the surface image of the tip of the electron source can be observed during the field evaporation when the field evaporation is conducted while introducing an imaging gas such as He, Ne or $H_2$ at around $10^{-3}$ Pa to $10^{-2}$ Pa. This observation method is called field ion microscopy (FIM). The imaging gas is ionized at the tip of the electron source and emitted radially. A micro-channel plate (MCP) is placed on the facing plane for detecting the emitted ions, and thus the surface image of the tip of the electron source can be observed with atomic resolution.

FIG. 3 shows FIM images of the tip of a $CeB_6$-CFE electron source before and after field evaporation. The change in the surface shape due to the tip formation process S12 is explained using FIG. 3. Each bright spot in the FIM images corresponds to an atom, and an atom at a sharp point or at an atomic step, to which the field concentrates, is shown brightly. Moreover, a facet, which is a flat surface, does not have any sharp point and thus is dark.

As shown in FIG. 3(a), the facets on the (100) plane and the (110) plane are slanted and distorted in the FIM image before field evaporation. This indicates that the tip surface is distorted. FIG. 3(b) is an FIM image of the same electron source after field evaporation. The facets on the (100) plane and the (110) plane are round in FIG. 3(b). The results show that the distortion of the tip of the electron source is removed by field evaporation and that the tip is formed into an even globular shape.

Next, in the surface reconstruction process S13, Ce is segregated on the surface of the field-evaporated electron source, and the work function is decreased. As a result of investigation of the inventors, it was found that B is exposed on the surface of the electron source directly after field evaporation, and thus there are problems because the work function is large and is not suitable for an electron source. Therefore, the surface is changed into a surface suitable for the electron source in the surface reconstruction process S13. Reasons why B is exposed on the surface of the $CeB_6$-CFE electron source and a method for exposing Ce on the surface are explained below.

FIG. 4 is an atomic model showing the unit cell of $CeB_6$. $CeB_6$ has a body-centered cubic lattice and has a Ce atom and a $B_6$ molecule in the form of a regular octahedron consisting of six B atoms. There are eight $B_6$ molecules around one Ce atom.

FIG. 5 is an atomic model of the tip of a $CeB_6$-CFE electron source. In this figure, a $CeB_6$-CFE electron source having a <100> crystal axis is shown for explanation. $CeB_6$ has a structure in which Ce atom layers and $B_6$ molecule layers are arranged alternately. While the power of B—B binding is strong, the powers of Ce—Ce and Ce—B bindings are weak. Accordingly, even when Ce in the underlaying layer appears on the surface after B in the top layer evaporates through field evaporation of $CeB_6$, the Ce evaporates immediately. As a result, B is mainly exposed on the surface of the electron source as shown in FIG. 5.

Here, when B is exposed on the surface of the tip of the electron source, the work function is large, and the extraction voltage required for electron emission is high. Moreover, the energy width of the electron beam becomes great. Accordingly, such a material is not suitably used as an electron source. To use $CeB_6$ for a CFE electron source, it is desirable that Ce is exposed on the surface and that the work function is reduced. The inventors have found that when field-evaporated $CeB_6$ is heated for a certain period, the reconstruction of the surface is caused, and the work function can be reduced.

FIG. 6 shows the measurement results of field emission microscopy (FEM) images of field-evaporated $CeB_6$-CFE electron sources that were heated for two minutes at different temperatures. The surface reconstruction by heating is explained using this figure.

FEM is a method in which an electron beam emitted from an electron source through field emission is projected on a fluorescent screen or an MCP and in which the electron-emitting points on the surface of the electron source are examined from the emission pattern. A part with a higher degree of field concentration and a smaller work function is brighter. The symmetric property and the strength of a pattern indicate the arrangement of the electron-emitting faces on the surface of the electron source, the corresponding crystal faces and a difference in the surface state.

Figure 6B:
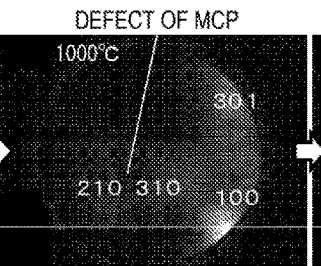
Figure 6C:
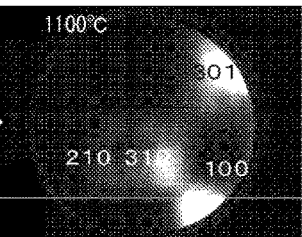
Figure 6D:
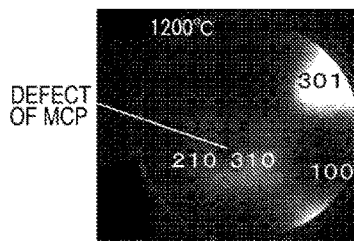
Figure 6E:
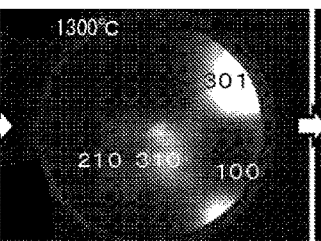
Figure 6F:
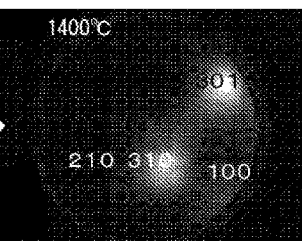
Figure 6G:
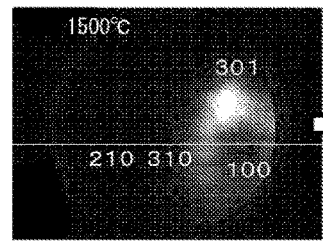
Figure 6H:
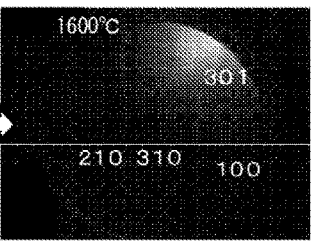

As shown in FIG. 6(a), the FEM image after heating at 900° C. does not have any symmetric pattern. However, as shown in FIG. 6(b), the FEM image after heating at 1000° C. shows that electrons are emitted from the {310} plane and the {210} plane, and the image has a cross pattern with 4-fold rotational symmetry with (100) in the center. As shown in FIGS. 6(c), (d) and (e), the FEM images after heating to 1100° C. to 1300° C. similarly show that the {310} plane and {210} emit electrons and that electron emission from the (100) plane is not observed anymore. As shown in FIG. 6(f), the FEM image after heating at 1400° C. shows that electron emission from the (210) plane is not observed anymore and that electrons are emitted from the (310) plane only. As shown in FIG. 6(g), the FEM image after heating at 1500° C. shows that electrons are emitted from around the (100) plane rather than the {310} plane. As shown in FIG. 6(h), the FEM image after heating at 1600° C. shows that the electron-emitting points are not symmetric and that strong electron emission is observed from a part.

Figure 6I:
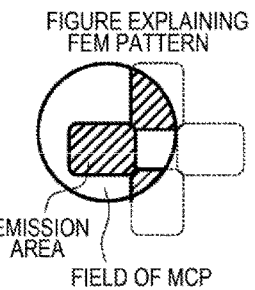

FIG. 6(i) is a figure showing the concept of the obtained FEM images. The FEM images shown in FIG. 6 were obtained by measurement using an MCP, and a part of each emission pattern is enlarged for observation. The results of FIG. 6(a) to (h) show that the surface state of the field-evaporated tip changes by heating to 1000° C. to 1400° C. and that an electron beam is emitted from the {310} plane. Here, when the heating process was conducted in the vacuum of $10^{-8}$ Pa or less, reproducibility was obtained with different CeB$_6$-CFE electron sources, and characteristics of an electron-emitting face and an electron beam with good reproducibility could be obtained. When the process was conducted under a pressure of $10^{-7}$ Pa or more, materials were easily adsorbed on the surface, and the electron-emitting face sometimes changed. Thus, it is suitable to heat under a pressure of $10^{-8}$ Pa or less.

FIG. 7 shows the results of measurement of extraction voltages required for obtaining a total current of 10 nA at different heating temperatures. Because the surface of a CeB$_6$-CFE electron source directly after field evaporation has a large work function, the required extraction voltage is as high as 1.2 kV. On the other hand, the extraction voltage decreased to 0.45 kV by heating to 1000° C. to 1500° C. This means that the work function decreased by heating at such a temperature and that a surface suitable for electron emission was formed. The extraction voltage further decreased to 0.15 kV after heating at 1600° C. This was because the surface of the electron source evaporated and because some protrusions were formed. Because an electron beam emitted from an evaporated surface does not have reproducibility, heating at 1600° C. is not suitable.

The results in FIG. 6 and FIG. 7 in combination show that a surface with a small work function suitable for field emission is formed on the {310} plane and the {210} plane by heating at 1000° C. to 1300° C. and on the {310} plane at 1400° C. Moreover, the surface gradually breaks at 1500° C. or higher, and the surface evaporates at 1600° C. It can be therefore understood that, when the heating period is two minutes, an electron beam from the {310} plane can be obtained by heating to 1000° C. to 1400° C.

Because the FEM images of NPL 1 are different from the FEM images of this Example, it is believed that the surface states of the tips of the electron sources, such as the arrangement of the crystal faces, the facet structures and the work functions, are different and that the characteristics of the obtained electron beams are also different.

Because a surface with a small work function cannot be obtained unless Ce is exposed on the surface, it is believed that Ce was segregated on the {310} plane by heating and that the work function decreased. As described above, Ce—Ce or Ce—B binding is weaker than B—B binding. Therefore, in CeB$_6$ in heated state, a Ce atom can come out of the B$_6$ cell and can move by diffusion. Ce precipitates from inside of CeB$_6$ by heating, and Ce covers B on the surface and is exposed. Moreover, Ce on the surface of the root part of the electron source moves to the tip through surface diffusion. It is believed that Ce which has moved by diffusion is segregated first especially on the {310} plane, resulting in the surface reconstruction, and that the work function is thus reduced.

As shown in FIG. 5, on the (310) plane of a field-evaporated CeB$_6$-CFE electron source, the number of Ce atom exposed on the top surface layer is one per unit cell, and the number of B$_6$ molecules is three. Here, the ratio of the Ce atoms to the B atoms is 1 to 18, and 5% of all the atoms on the (310) plane are Ce.

Through the surface reconstruction, the number of Ce atoms exposed on the (310) plane increases compared to this state, and the work function decreases. There are two sites for Ce adsorption in a unit cell. When one of the sites is occupied by Ce, the number of Ce atoms exposed to the vacuum side is two, and the number of B$_6$ molecules is two. At this point, the number of Ce atoms and the number of B$_6$ molecules become the same, and it is believed that the decrease in the work function due to Ce becomes significant when the number of Ce atoms is larger. The ratio of the Ce atoms to the B atoms here is 2 to 12, and 14% of the atoms in the top surface layer of the (310) plane are Ce.

It is more preferable that the two adsorption sites are occupied by Ce, and the decrease in the work function due to Ce becomes significant. At this point, the number of Ce atoms in a unit cell plane is three, and the number of B$_6$ molecule is one. The ratio of the Ce atoms to the B atoms is 1 to 6, and 33% of the atoms in the top surface layer of the (310) plane are Ce. The CFE electron source is operated at room temperature or lower, and it is thus believed that adsorption of Ce of two atom layers or more is also possible. Accordingly, it is believed that Ce can be segregated on the surface in a manner that the proportion of Ce atoms on the surface becomes 33% or more.

The surface reconstruction can also be conducted at a decreased heating temperature for a prolonged heating period. FIG. 8 shows FEM images of a case in which the heating temperature was 800° C. and in which heating was conducted up to 22 hours. While no electron-emitting face could be obtained by heating for two minutes as shown in FIG. 8(b), an FEM image similar to that of the case of heating at 1000° C. for two minutes shown in FIG. 6(b) was obtained after two hours as shown in FIG. 8(b). Moreover, as shown in FIG. 8(c), an FEM image similar to that of the case of heating at 1100° C. for two minutes shown in FIG. 6(c) was obtained after 22 hours.

Even when the heating temperature is 700° C., a similar FEM image can be obtained by heating for several dozen hours, and the surface reconstruction can be conducted. A reason why a long period is required at a low temperature is that the diffusion speed of Ce is in proportion to a power of the temperature. Theoretically, the surface reconstruction is possible also at a lower temperature. However, a heating period of several days to several dozen says is required, and thus the utility is poor.

On the other hand, as the heating temperature increases, the surface reconstruction can be conducted in a shorter heating period. For example, the reconstruction finishes in about 20 seconds or shorter by heating at 1200° C. or higher. The period can be made several seconds or shorter at a higher temperature. In this regard, however, when the heating temperature is increased and when the period is shortened, the possibility that the surface breaks is higher. Moreover, the heating temperature has its upper limit, and the surface state starts to break at 1500° C. or higher as shown in FIG. 6(g), which is not suitable. Accordingly, to achieve a practical period and to minimize the risk of surface breakage, heating at 1000° C. to 1400° C. for around five seconds or longer and 10 minutes of shorter is preferable. By prolonging the heating period and decreasing the heating temperature, an electron-emitting face having good reproducibility can be formed without the risk of surface breakage.

The surface reconstruction changes not only the kind of atoms exposed on the surface of the electron source but also the surface structure. FIG. 9 shows FIM images and FEM images before and after the surface reconstruction process S13. The magnifications of the tip surface of the electron source of FIM and FEM are almost the same. Therefore, a crystal face in an FIM image is almost at the same position to that in the FEM image. By comparing the FIM images and the FEM images, the crystal faces which emit electrons more likely can be examined.

As shown in FIG. 9(a), the FIM image before the surface reconstruction shows the field evaporation end form directly after the field evaporation. In this FIM image, facets of the (100) plane and the (210) plane and a part of the facet of the (110) plane can be seen, but bright spots are observed in the entire image. This indicates that the tip of the electron source is formed in a globular shape. FIG. 9(c) is an FEM image after field emission from the surface of the electron source. Electrons are emitted from the (100) plane in the case of a field-evaporated surface. However, because B is exposed on the surface as described above, the work function is large, and the extraction voltage required for obtaining a total current of 10 nA is as high as 1.2 kV.

As shown in FIG. 9(b), dark areas of the (100) plane, the (210) plane and the (110) plane spread in the FIM image after the surface reconstruction. This indicates that facets have grown and that a flat area increased. In addition, facets were formed also on the {311} plane and the {211} plane, and the surface has changed into a thermal end form of a polygonal shape formed by a combination of facets from the field evaporation end form. When facets are formed in a self-organization manner and surround the (310) plane, the (310) plane becomes pointed as compared to the curvature of the entire surface. As a result, the degree of field concentration increases locally. Therefore, in addition to the decrease in the work function, the change in the shape is also a cause for the field emission from the (310) plane. FIG. 9(d) is an FEM image corresponding to the surface shown in FIG. 9(b). Electrons were emitted from the {310} plane and the {210} plane, and the extraction voltage decreased to 0.45 kV.

Even when ions collide with the surface of the electron source and change the atomic structure, the surface returns to the thermal end form shown in FIG. 9(b) by conducting the surface reconstruction process S13 again. Therefore, the atomic structure of the tip of the electron source can be repaired by the surface reconstruction process S13.

FIG. 10 shows Fowler-Nordheim (FN) plots before and after the surface reconstruction process S13. The work function after the surface reconstruction can be determined from the results.

The relation between the emission current I (A) of an electron beam obtained through field emission and the extraction voltage V (V) is represented by the following equation using constants A and B.

[Math. 1]

$$\ln\frac{I}{V^2} = \frac{B}{V} + A \quad (1)$$

From this equation, a graph drawn by plotting 1/V on the horizontal axis and ln(I/V²) on the vertical axis is a straight line. This corresponds to the FN plots in FIG. 10. The constant B, which is the slope of the line, is represented by the following equation using the work function φ (eV) and the field concentration coefficient β (1/m), which is the average of the entire tip surface of the electron source.

[Math. 2]

$$B = -6.49 \times 10^9 \frac{\phi^{3/2}}{\beta} \quad (2)$$

Accordingly, the work function can be determined by comparing the slopes of the two lines. The slope before the surface reconstruction is −21858, and the slope after the surface reconstruction is −8525. B is exposed on the surface before the surface reconstruction, and it is believed that the work function is around the work function of B alone, namely 4.6 eV. From the values and equation (2), the work function of the surface after the surface reconstruction is around 2.46 eV. The results show that the work function of the $CeB_6$ surface decreased to 2.46 eV from 4.6 eV by heating.

In the electron beam emission process S14, an extraction voltage is applied to the $CeB_6$-CFE electron source to cause field emission.

The obtained FEM image is inspected in the pattern inspection S15. When the obtained FEM image has an emission pattern with 4-fold rotational symmetry from the {310} plane as shown in the FEM images of FIG. 6(b) to FIG. 6(f), the reconstruction of the surface is completed, and the electron source can be used. Moreover, the ratio of the angular current density to the total current described below, the energy width, the total current and the probe current relative to the extraction voltage, the changes in the currents relative to a change in the extraction voltage, the changes in the currents with time and the like are measured at the same time, and it is inspected whether the electron beam exhibits the desired properties.

Using the surface control process explained above using FIG. 2 to FIG. 10, the work function of the {310} plane of the $CeB_6$-CFE electron source can be decreased, and an electron beam with good reproducibility can be obtained from this plane.

Next, using FIG. 11A and FIG. 11B to FIG. 13, the characteristics of the electron beam obtained from the $CeB_6$-CFE electron source are explained. FIG. 11A and FIG. 11B show the results of FEM images of a CFE electron source using a W<310> single crystal (called a W-CFE electron source below) and a $CeB_6$-CFE electron source, respectively, measured with a fluorescent screen. As compared to the conventional W-CFE electron source, the $CeB_6$-CFE electron source is characterized in that an electron beam that is confined to the center is obtained.

As shown in FIG. 11A, in the FEM image of the W-CFE electron source, electron emission from a wide area is observed, and electrons are emitted from the {311} plane and the {111} plane in addition to the {310} plane. On the other hand, as shown in FIG. 11B, in the FEM image of the $CeB_6$-CFE electron source, electrons are emitted mainly from the {310} plane and the {210} plane, and the electron emission from the other crystal faces is weak. That is, the area emitting the electron beam is confined to a small area.

This means that a high probe current can be obtained with a low total current when the CeB$_6$-CFE electron source is used.

When the total current is low, the current applied to the extraction electrode decreases, and the amount of electron-stimulated desorption gas released from the electrode also reduces, resulting in reduced decrease in the degree of vacuum. As a result, a stable electron beam is obtained even when a high current is released. In addition, when the total current is low, contamination of the probe current with reflection electrons can be reduced. As a result, flare in the observation images of the electron microscope can be prevented.

FIG. 12 shows the results of comparison of the concentration degree of the electron beam among a W-CFE electron source and CeB$_6$-CFE electron sources. The CeB$_6$-CFE electron sources were two electron sources using a <310> single crystal and a <100> single crystal, and the characteristics were examined using the electron beams emitted from the (310) plane as the probe current. Using this figure, how much the electron beam of a CeB$_6$-CFE electron source is confined is explained.

Here, the concentration degree of an electron beam is defined as a value obtained by dividing the angular current density JΩ (μA/sr) of the probe current by the total current It (μA). The angular current density is the value of the probe current obtained per unit cubic area, and a brighter image can be obtained from the electron microscope as the value is larger.

In general, the angular current density JΩ becomes higher as the total current It increases. However, because a large number of electrons are emitted also from planes other than the {310} plane in a W-CFE electron source as shown in FIG. 11A, more wasted electrons which are not used as the probe are emitted. The concentration degree JΩ/It of the electron beam is about three. On the other hand, in the case of a CeB$_6$-CFE electron source, the electron-emitting faces are mainly the {310} plane and the {210} plane only, and the number of wasted electrons is small. The JΩ/It of a CFE electron source using a CeB$_6$<100> single crystal is six or more, and the JΩ/It of a CFE electron source using a CeB$_6$<310> single crystal is 13 or more. The results show that the JΩ/It becomes two times larger or more when the {310} plane of a CeB$_6$-CFE electron source is used in comparison to a W-CFE electron source and that a confined electron beam is obtained.

The JΩ/It of a CeB$_6$<310> single crystal is larger than that of a CeB$_6$<100> single crystal because the (310) plane is arranged at a position in the center of the tip of the electron source where the field concentrates the most and because the probe current is thus enhanced. The results show that the JΩ/It becomes six or more when a CeB$_6$-CFE electron source is used and that a probe current which is confined more than that of a W-CFE electron source is obtained.

FIG. 13 shows the calculation results of the energy widths of the electron beams emitted from a W-CFE electron source and a CeB$_6$-CFE electron source. It is explained using FIG. 13 that a narrower energy width is obtained when a CeB$_6$-CFE electron source is used. The energy distribution P(E)dE of an electron beam obtained through field emission is represented by the following equations.

[Math. 3]

$$P(E)dE = \frac{4\pi md}{h^3}\exp\left(-c + \frac{\phi'}{d}\right) \times \frac{e^{E/d}}{\exp[(E+\phi')/kT]+1} dE \quad (3)$$

[Math. 4]

$$c = \frac{4\sqrt{2m\phi'^3}}{3h_b eF} v \quad (4)$$

[Math. 5]

$$d = \frac{h_b eF}{2\sqrt{2m\phi'}} t \quad (5)$$

Here, m (kg) is the mass of electron; h (Js) is the Planck constant; h$_b$ (Js) is the Dirac constant; k (J/K) is the Boltzmann constant; T (K) is the temperature; F (V/m) is the field intensity; e (c) is the elementary charge; φ' (J) is the work function with its unit converted to joule; and t and v are correction terms. Here, h$_b$ is not the generally used letter for the Dirac constant, which is the Planck constant h divided by 2π, but h$_b$ is used in this application because the letter should not be used in an application. FIG. 13 shows the results of the energy widths determined by calculating the energy distributions of the electron beams emitted from the W (310) having a work function of 4.3 eV and from the CeB$_6$ (310) plane having a work function of 2.46 eV using the equations (3), (4) and (5).

The energy width of an electron beam obtained from a W-CFE electron source is generally up to around 0.4 eV, and it is thus believed that the current density used is 1×10$^{13}$ A/m$^2$ or less. The energy width of the CeB$_6$-CFE electron source here is 0.27 eV or less, and it can be seen that the energy width decreases compared to that of the W-CFE electron source. The difference in energy widths differs with the current density used, but the energy width of CeB$_6$ is lower than that of W by around 0.08 eV to 0.14 eV. The results show that high spatial resolution can be achieved during low acceleration observation when a CeB$_6$-CFE electron source is installed in an SEM.

Next, it is explained that higher brightness is obtained when a CeB$_6$-CFE electron source is used. The converted axial brightness B$_0$/V$_0$ (A/m$^2$ srV) of an electron beam obtained through field emission is represented by the following equation.

[Math. 6]

$$\frac{B_0}{V_0} = \frac{ej}{\pi d} \quad (6)$$

Here, B$_0$ (A/m$^2$ sr) is the axial brightness; V$_0$ (V) is the acceleration voltage; j (A/m$^2$) is the current density; e (c) is the elementary charge; and d is the energy represented by equation (5). The axial brightness is represented as the limit of the current per small area and small solid angle. Because the axial brightness is in proportion to the acceleration voltage, the properties of electron sources themselves are compared using the converted axial brightness obtained by dividing the axial brightness by the acceleration voltage.

Under the conditions of a current density j of 1×10$^{12}$ A/m$^2$, while the converted axial brightness of W-CFE is 9.6×10$^{11}$ A/m$^2$ srV, the converted axial brightness of a CeB$_6$-CFE electron source is 1.8×10$^{12}$ A/m$^2$ srV. This difference is based on the difference in the work function between the W-CFE electron source and the CeB$_6$-CFE electron source, and the converted axial brightness of the CeB$_6$-CFE electron source is around two times the value of the W-CFE electron source at any current density. Accordingly, when a CeB$_6$-CFE electron source is used for an electron microscope, the current can be increased. Moreover, because the coherence of the electron beam can be increased, the properties of a transmission electron microscope (TEM) or a scanning transmission electron microscope (STEM) can also be improved.

As explained above using FIG. 11A and FIG. 11B to FIG. 13, when a CeB$_6$-CFE electron source is used, a high concentration degree of the electron beam, a narrow energy width and high brightness can be obtained, and the properties of the electron microscope can be improved.

Next, the structure of an SEM having a CeB$_6$-CFE electron source and the operation method are explained using FIG. 14 to FIG. 16.

FIG. 14 illustrates an SEM having a CeB$_6$-CFE electron source. The column of an SEM is composed of an electron gun 921, a column 922 and a sample chamber 923. Gas is discharged from the electron gun 921 with an ion pump 924 and a non evaporable getter (NEG) pump 925, and the pressure is around $10^{-8}$ Pa to $10^{-10}$ Pa. The electron gun 921 and the column 922 have a differential pumping structure, and gas is discharged with an ion pump 926 and an ion pump 927. Gas is discharged from the sample chamber 923 with a turbo-molecular pump 928.

A CeB$_6$-CFE electron source 929 is placed in the electron gun 921. The CeB$_6$-CFE electron source 929 undergoes the surface control process shown in FIG. 2 in advance in another vacuum chamber and is then installed to the SEM after forming the electron-emitting face. By keeping the pressure of the electron gun 921 at $10^{-8}$ Pa or less, absorption of gas to the surface of the electron source is reduced, and the change in the current of the electron beam with time is minimized. An extraction electrode 930 is placed on a plane facing the CeB$_6$-CFE electron source 929. By applying an extraction voltage between the CeB$_6$-CFE electron source 929 as the negative electrode and the extraction electrode 930 using an extraction power supply 941, an electron beam 931 is emitted from the CeB$_6$-CFE electron source 929 through field emission. Using an acceleration power supply 942, an acceleration voltage is applied between the CeB$_6$-CFE electron source 929 and an acceleration electrode 932. The electron beam 931 is accelerated or decelerated between the extraction electrode 930 and the acceleration electrode 932 due to the potential difference. The extraction electrode 930 and the acceleration electrode 932 have a Butler lens structure and reduce the aberration. The condensing action of the Butler lens increases the angular current density of the electron beam. The increase is in proportion to the ratio of the acceleration voltage and the extraction voltage. Because the work function of the CeB$_6$-CFE electron source is smaller than that of the conventional W-CFE electron source, the required extraction voltage is low. As a result, the effect of the Butler lens of increasing the angular current density is enhanced.

Then, the electron beam 931 is condensed with a condenser lens 933, and the solid angle used is determined by an aperture 934. The electron beam 931 is then reduced to a small spot with a condenser lens 935 and an objective lens 936, scanned with a scanning coil which is not illustrated and applied to a sample 937. A deceleration field is applied between the objective lens 936 and the sample 937 to improve the spatial resolution during low acceleration observation. When the electron beam 931 is applied, secondary electrons are emitted from the sample 937. A sample image is obtained by detecting the secondary electrons with a detector 938 and is displayed to the user through a display (display unit) 943.

A heating power supply 944 is connected to the CeB$_6$-CFE electron source 929, and the CeB$_6$<310> single crystal 901 can be heated by letting a current flow through the heating unit 903. The heating power supply 944, the extraction power supply 941, the acceleration power supply 942, the detector 938, the condenser lens 933, the condenser lens 935, the objective lens 936 and the aperture 934 are connected to a controller (controller unit) 945, and the user can change the operational conditions through the display 943. For example, the user can select a heating temperature, a heating period, any one of or a combination of a current, a voltage and an electric power corresponding to the heating temperature obtained during tip production or a level indicating a heating strength through the display 943 and input them to the heating power supply. By constantly monitoring the states of the devices, the entire SEM can be maintained in the optimal state without the instructions of the user.

FIG. 15 is a flowchart showing the observation procedures of an SEM having a CeB$_6$-CFE electron source. When the user starts the observation, the residual gas adsorbed on the surface of the tip of the CeB$_6$-CFE electron source is first removed in a cleaning process S51. Next, an electron beam is emitted from the CeB$_6$-CFE electron source in an electron beam emission process S52. In current inspection S53, the current of the electron beam is measured, and sample observation S54 is started when the current satisfies the standard which is set in advance. When the current does not satisfy the standard, a surface reconstruction process S55 is conducted in the electron gun 921, and the surface of the electron source is returned to the initial state. Each process is explained below.

In the cleaning process S51, the CeB$_6$<310> single crystal 901 is heated to 900° C. or higher for an instant, and the gas adsorbed on the surface is desorbed. FIG. 16 shows FEM images after heating CeB$_6$-CFE electron sources to which gas has been adsorbed on the surface. In this experiment, CeB$_6$-CFE electron sources after the surface control process of FIG. 2 were once placed in the atmosphere, put in a vacuum chamber again, heated at different temperatures and subjected to FEM.

Figure 16A:
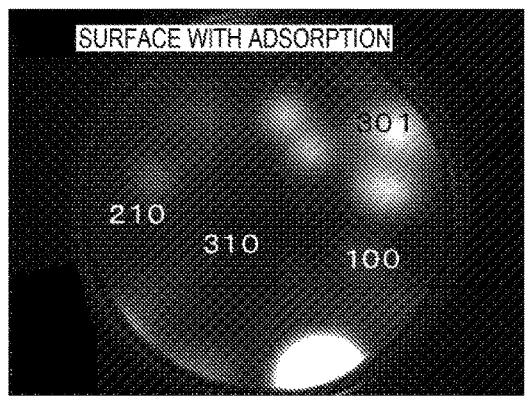
FIGS. 16A to 16D are FEM images after heating of CeB$_6$-CFE electron sources to which gas has been adsorbed on the surface.
Figure 16B:
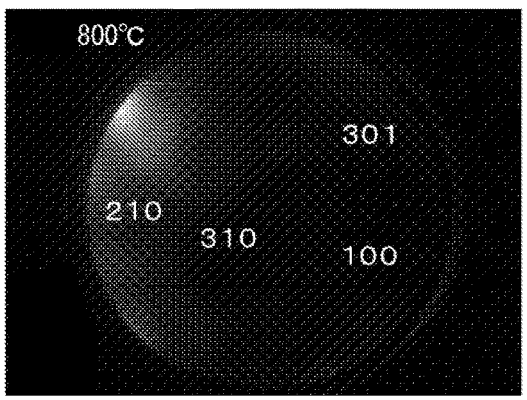
Figure 16C:
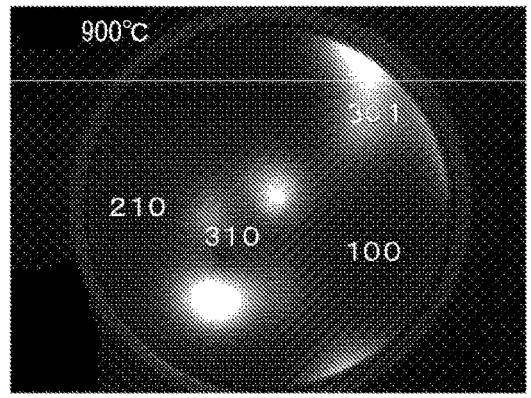
Figure 16D:
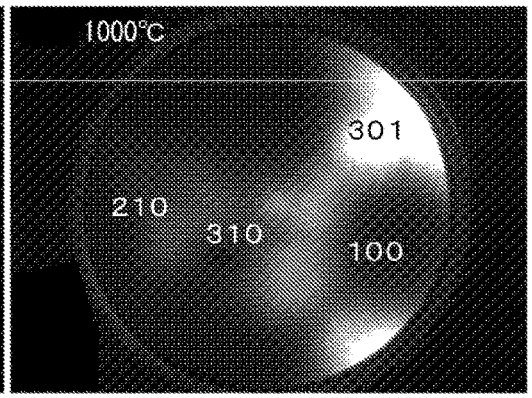

As shown in FIG. 16(a), the FEM image with the surface with adsorption did not have any symmetric emission pattern, and the pattern blinked and changed constantly. As shown in FIG. 16(b), the FEM image after heating at 800° C. did not have any symmetric emission pattern, either. However, as shown in FIG. 16(c), in the FEM image after heating at 900° C., electron emission from the {310} plane and the {210} plane, which is similar to that after the surface reconstruction by heating at 1100° C. for two minutes shown in FIG. 6(c), was obtained again. The extraction voltage required for field emission reduced as compared to that with the surface with adsorption. As shown in FIG. 16(d), the FEM image after heating at 1000° C. was a symmetric FEM image similar to that of FIG. 16(c). When the heating temperature was further increased to 1500° C. or higher, the emission pattern started to be disturbed. The results show that the surface of the CeB$_6$-CFE electron source should be heated at 900° C. or higher and 1400° C. or lower to clean the surface. In this regard, because the adsorbed gas desorbs in an instant, the heating period may be a second or shorter. Although the heating period could be as long as several minutes, the effects did not change. By intermittently heating at 900° C. or higher and 1400° C. or lower for several seconds or shorter in this manner, the surface of the $CeB_6$-CFE electron source can be kept clean, and the work function can be made constant.

When the user conducts the cleaning process S51, the user can set and input any heating conditions through an input unit attached to the display 943. The values to be set here include a heating temperature, a heating period and any one of or a combination of an applied current, a voltage and an electric power corresponding to the temperature of the electron source calibrated during the production of the electron source. Alternatively, a level indicating a heating strength which is set in advance may be selected. It was found that, although heating at 2000° C. or higher is required to desorb the adsorbed gas in the case of a W-CFE electron source, a $CeB_6$-CFE electron source can be cleaned at a low temperature of 900° C. or higher. This difference is due to the difference in the binding energy of the material and the residual gas and caused because the binding energy of $CeB_6$ is smaller than that of W. In addition, heating at 900° C. or higher also includes the temperature for the reconstruction of the $CeB_6$ surface. Accordingly, the cleaning process S51 also has the effects of segregating Ce on the surface and repairing the shape. In this regard, the $CeB_6$-CFE electron source can be intermittently heated to 900° C. or higher and 1400° C. or lower by controlling the heating power supply with the controller.

In particular, the binding energy of hydrogen, which is the main component of the residual gas in the ultra-high vacuum, and $CeB_6$ is low, and thus the gas could be desorbed by heating at a low temperature of 400° C. or higher when the gas contained hydrogen only. Therefore, by intermittently heating the $CeB_6$-CFE electron source to 400° C. to 700° C. for several seconds during the SEM observation, the adsorption of hydrogen can be minimized, and the change in the work function of the surface can be reduced. At such a low temperature, the atoms on the surface move only slightly, and the characteristics of the electron beam do not change. Moreover, heating for several seconds or shorter does not disturb the observation. As a result, a stable electron beam can be always obtained without bothering the user. This treatment can be also carried out automatically based on the heating strength, the operational period and the schedule of intervals which are set in advance.

In the electron beam emission process S52, an extraction voltage is applied between the $CeB_6$-CFE electron source 929 and the extraction electrode 930, and thus an electron beam is emitted through field emission.

In the current inspection S53, the current of the electron beam is measured with the aperture 934 or the like, and it is inspected whether the current satisfies the standard which is set in advance. Examples of the standard are the above ratio of the angular current density $J\Omega$ to the total current It of six or more, the total current and the probe current relative to a certain extraction voltage, the changes in the currents relative to a change in the extraction voltage, the changes in the currents with time and the like. When the current of the electron beam does not satisfy the standard, it can be determined that the surface state of the electron source is in an abnormal condition. Then, the surface reconstruction process S55 is conducted again in the electron gun 921, and the electron-emitting face is formed on the surface of the electron source again. The surface reconstruction process S55 is similar to the surface reconstruction process S13 explained in FIG. 2. For example, even when ions of the residual gas collide with the surface of the electron source, cause sputtering and change the surface shape, through the surface reconstruction process S55, facets grow, and the atomic structure can be returned to the initial state. When Ce is segregated on the surface again, a surface with a small work function can be obtained. The $CeB_6$-CFE electron source can be controlled at 700° C. or higher and 1400° C. or lower, desirably at 1000° C. or higher and 1400° C. or lower by controlling the heating power supply with the controller.

In the sample observation S54, the user observes and analyzes any sample.

Using the SEM having the $CeB_6$-CFE electron source explained above using FIG. 14 to FIG. 16, an electron beam having excellent characteristics can be obtained with good reproducibility, and high spatial resolution can be stably achieved also during low acceleration observation.

Here, the $CeB_6$-CFE electron source 929 which is installed to the SEM may undergo the processes up to the tip formation process S12 shown in FIG. 2 in another vacuum chamber in advance. In this case, the surface reconstruction process S13 is conducted in the SEM, and the electron-emitting face is formed. Because the pattern inspection S15 cannot be conducted in the SEM, whether the electron-emitting face has been formed is determined using the current inspection S53 shown in FIG. 15. By installing an electron source which has undergone the processes up to the tip formation process S12, the electron source in which B is exposed on the surface is transported in the atmosphere, and the oxidation of Ce on the surface can be prevented. As a result, because Ce is not oxidized, Ce can be easily segregated by the surface reconstruction in the SEM.

According to this Example, an electron beam apparatus which can stably achieve high spatial resolution also during low acceleration observation using $CeB_6$ for the CFE electron source can be provided. Moreover, by providing a controller for controlling the heating power supply in a manner that the temperature of the CFE electron source becomes a certain temperature (for example, 700° C. or higher and 1400° C. or lower), the surface reconstruction can be conducted in the electron beam apparatus.

Example 2

An SEM having the $CeB_6$-CFE electron source according to Example 2 of the invention is explained. The items that are described in Example 1 but are not described in this Example can be applied also to this Example as far as there are no special reasons. In this Example, an SEM in which a tip formation process and a surface reconstruction process of the $CeB_6$-CFE electron source are conducted in the electron gun is explained using FIG. 17 and FIG. 18. Using this structure, the electron-emitting face can be formed again, and the observation can be started again without replacing the electron source, even when the electron source has a serious abnormality.

FIG. 17 is a schematic sectional view showing the structure of the SEM of this Example, in which the tip formation process is conducted in the electron gun. Unlike the structure of the SEM of Example 1 shown in FIG. 14, the SEM has an ambipolar power supply 961, which can switch the positive electrode and the negative electrode for applying a voltage, instead of the acceleration power supply 942. In addition, an NEG heating power supply 962 is connected to the NEG pump 925, and the NEG pump 925 can be heated and controlled by the controller 945.

When the $CeB_6$-CFE electron source 929 is heated to 1600° C. or higher by mistake, the surface evaporates as shown in the FEM image of FIG. 6(h), and the reproducibility of the electron beam is lost. To obtain an electron beam having good reproducibility again from this electron source, the surface reconstruction process S13 of the electron source shown in FIG. 2 alone is often insufficient, and the tip formation process S12 is also necessary. Therefore, the tip formation process can be conducted in the electron gun in this Example, and the electron-emitting face is repaired at the site even when the surface of the electron source has a serious abnormality.

FIG. 18 is a flowchart of the reformation of the electron-emitting face in the SEM. When an abnormality of the electron source is observed, field evaporation is conducted in a tip formation process S71, and the tip of the electron source is formed into a globular shape. Next, by heating the electron source in a surface reconstruction process S72, Ce is segregated on the surface, and an electron-emitting face is formed on the {310} plane. Then, an electron beam is emitted through field emission from the electron source in an electron beam emission process S73. The current of the electron beam is measured in current inspection S74, and sample observation S75 is conducted when the current satisfies the standard. When the current does not satisfy the standard, the surface reconstruction process S72 is conducted again. Each process is explained below.

The abnormality of the electron source corresponds to, for example, a case in which the current of the electron beam emitted through field emission does not satisfy the standard that is set in advance and in which the current does not satisfy the standard even after the surface reconstruction process is repeated several times. The criteria of the abnormality are for example: $J\Omega/It>6$ is not satisfied; the total current and the probe current relative to the extraction voltage are outside the defined ranges; the changes in the currents relative to a change in the extraction voltage are outside the defined ranges; and the degrees of the changes in the currents with time are outside the defined ranges.

In the tip formation process S71, the $CeB_6$-CFE electron source 929 is field-evaporated in the electron gun 921 shown in FIG. 17. For the field evaporation, the NEG pump 925 is first heated using the NEG heating power supply 962, and the hydrogen adsorbed and stored in the NEG pump 925 is released. The relation between the heating temperature here and the pressure in the gun is calibrated in advance, and the pressure in the gun is increased to around $10^{-3}$ Pa to $10^{-2}$ Pa.

Next, a voltage is applied between the $CeB_6$-CFE electron source 929 and the extraction electrode 930 using the ambipolar power supply 961. Here, the $CeB_6$-CFE electron source 929 serves as the positive electrode, and a field of plus several dozen volts per nanometer is applied to the surface of the tip. As a result, field evaporation of the surface is caused, and the unevenness or the distortion on the electron source surface, impurities that cannot be removed by heating or the like are removed, resulting in the formation of a globular shape. The voltage applied here and the speed of field evaporation are calibrated in advance, and the optimal voltage is applied. Regarding the conditions for applying the voltage, based on the field evaporation voltage during the tip production recorded in the apparatus, voltages with a set upper limit are added step-wise. It is more desirable that the voltage applied is in the pulse state and that the tip of the electron source is formed into the optimal shape by controlling the evaporation speed.

Here, when hydrogen is introduced into the electron gun 921, the voltage required for field evaporation decreases. This is because hydrogen acts chemically on the surface of the electron source and makes field evaporation occur easily. The voltage applied can be reduced, and thus there is an advantage because the voltage resistance inside the electron gun 921 can be low.

After the completion of the field evaporation of the $CeB_6$-CFE electron source 929, heating of the NEG pump 925 is stopped, and gas is discharged from the electron gun 921 to a pressure of $10^{-8}$ Pa or less again.

The gas to be introduced may also be an active gas other than hydrogen. The gas can be introduced through a variable leak valve from a high-pressure cylinder which contains the gas and which is attached to the electron gun 921.

In addition, the gas to be introduced may also be an inactive gas such as He, Ne and Ar. Such a gas does not have the effect of reducing the voltage required for field evaporation but has an advantage because unnecessary electric discharge is prevented. The field evaporation can be conducted also in the vacuum. In this case, it is not necessary to heat the NEG pump 925.

In the surface reconstruction process S72, by heating the $CeB_6$-CFE electron source for a certain period in the electron gun, Ce is segregated on the {310} plane, and the electron-emitting face is formed. The process is similar to the surface reconstruction process S13 shown in FIG. 2.

In the electron beam emission process S73, an extraction voltage is applied between the $CeB_6$-CFE electron source 929 and the extraction electrode 930 using the extraction power supply 941 shown in FIG. 17, and thus the electron beam 931 is emitted from the $CeB_6$-CFE electron source 929 through field emission.

In the current inspection S74, the current of the electron beam 931 is measured with the aperture 934 or the like, and it is inspected whether the current satisfies the standard which is set in advance. The standard is similar to that of the current inspection S53 in FIG. 15. When the current of the electron beam satisfies the standard, the user starts the sample observation S75. In this manner, an electron beam having excellent characteristics can be obtained with good reproducibility, and high spatial resolution can be stably achieved also during low acceleration observation. When the current of the electron beam does not satisfy the standard, it can be determined that the formation of the electron-emitting face on the surface of the electron source is insufficient. Thus, the surface reconstruction process S72 is conducted again in the electron gun 921, and the electron-emitting face is formed on the surface of the electron source again.

Because the tip formation process can be conducted in the electron gun in this Example, an electron source which has undergone the processes up to the sharpening process S11 shown in FIG. 2 in advance can be installed, and the tip formation process S12 and the remaining surface control process can be first conducted in the electron gun. In this case, because the other vacuum chamber for conducting the surface control process in advance is not necessary, there is an advantage of reduced production costs.

Using the SEM explained above using FIG. 17 and FIG. 18, the electron-emitting face can be formed again, and the observation can be started again without replacing the electron source, even when the electron source has a serious abnormality. Examples of installation to an SEM have been shown in Example 1 and Example 2. However, when the $CeB_6$-CFE electron source is installed to another electron beam apparatus such as a TEM, a STEM, a FIB-SEM or an electron beam exposure equipment, the properties of the apparatus can also be improved.

According to this Example, effects similar to those of Example 1 can be obtained. Moreover, by providing a controller for controlling the ambipolar power supply in a manner that the electron source is field-evaporated, the tip can be formed in the electron beam apparatus.

The invention is not limited to the Examples described above and includes various examples with modifications. For example, the Examples described above have been explained in detail merely for easy understanding of the invention, and the invention should not be limited to those having all the explained components. Moreover, a component of an Example can be replaced with a component of the other Example, and a component of an Example can be added to the structure of the other Example. Another component can be added to the structure of an Example, or a component of an Example can be deleted or replaced with another component.

REFERENCE SIGNS LIST

901 . . . CeB$_6$<310> single crystal, 902 . . . holding unit, 903 . . . heating unit, 904 . . . heating electrode, 905 . . . insulating unit, 906 . . . pin, 921 . . . electron gun, 922 . . . column, 923 . . . sample chamber, 924 . . . ion pump, 925 . . . NEG pump, 926 . . . ion pump, 927 . . . ion pump, 928 . . . turbo-molecular pump, 929 . . . CeB$_6$-CFE electron source, 930 . . . extraction electrode, 931 . . . electron beam, 932 . . . acceleration electrode, 933 . . . condenser lens, 934 . . . aperture, 935 . . . condenser lens, 936 . . . objective lens, 937 . . . sample, 938 . . . detector, 941 . . . extraction power supply, 942 . . . acceleration power supply, 943 . . . display (display unit), 944 . . . heating power supply, 945 . . . controller (controller unit), 961 . . . ambipolar power supply, 962 . . . NEG heating power supply, S11 . . . sharpening process, S12 . . . tip formation process, S13 . . . surface reconstruction process, S14 . . . electron beam emission process, S15 . . . pattern inspection, S51 . . . cleaning process, S52 . . . electron beam emission process, S53 . . . current inspection, S54 . . . sample observation, S55 . . . surface reconstruction process, S71 . . . tip formation process, S72 . . . surface reconstruction process, S73 . . . electron beam emission process, S74 . . . current inspection, S75 . . . sample observation

The invention claimed is:

1. An electron beam apparatus having a cold field emission electron source characterized in that
the emitter of the electron beam of the cold field emission electron source is Ce hexaboride or a hexaboride of a lanthanoid metal heavier than Ce,
the hexaboride emits the electron beam from the {310} plane, and
the number of the atoms of the lanthanoid metal on the {310} plane is larger than the number of boron molecules comprising six boron atoms on the {310} plane.

2. The electron beam apparatus according to claim 1 characterized in that facets are formed on the {210} plane and the {211} plane of the hexaboride.

3. The electron beam apparatus according to claim 1 characterized in that the {310} plane is formed with a pillar tip of the hexaboride that has been sharpened by electrolytic polishing, then field-evaporated and heated.

4. The electron beam apparatus according to claim 3 characterized in that the temperature for heating the hexaboride is 700° C. or higher and 1400° C. or lower.

5. The electron beam apparatus according to claim 1 characterized by further having
a heating power supply for heating the cold field emission electron source and
a controller unit for controlling the heating power supply in a manner that the temperature of the cold field emission electron source intermittently becomes 900° C. or higher and 1400° C. or lower.

6. The electron beam apparatus according to claim 3 characterized by further having
a heating power supply for heating the cold field emission electron source and
a display unit in which a heating temperature, a heating period, any one of or a combination of a current, a voltage and an electric power corresponding to the heating temperature obtained during tip production or a level indicating a heating strength is selected and input to the heating power supply.

7. The electron beam apparatus according to claim 1 characterized in that the proportion of the atoms of the lanthanoid metal to all the atoms on the surface of the {310} plane is 33% or more.

8. An electron beam apparatus having a cold field emission electron source characterized in that
the emitter of the electron beam of the cold field emission electron source is Ce hexaboride or a hexaboride of a lanthanoid metal heavier than Ce, and
the full width at half maximum of the energy distribution of the electron beam emitted from a plane including the {310} plane of the hexaboride is 0.27 eV or less.

9. The electron beam apparatus according to claim 8 characterized in that facets are formed on the {210} plane and the {211} plane of the hexaboride.

10. The electron beam apparatus according to claim 8 characterized in that the {310} plane is formed with a pillar tip of the hexaboride that has been sharpened by electrolytic polishing, then field-evaporated and heated.

11. The electron beam apparatus according to claim 10 characterized in that the temperature for heating the hexaboride is 700° C. or higher and 1400° C. or lower.

12. An electron beam apparatus having a cold field emission electron source characterized in that
the emitter of the electron beam of the cold field emission electron source is Ce hexaboride or a hexaboride of a lanthanoid metal heavier than Ce, and
the ratio JΩ/It of the angular current density JΩ (μA/sr) of the electron beam emitted from a plane including the {310} plane of the hexaboride to the total current It (μA) emitted from the cold field emission electron source is six or more.

13. The electron beam apparatus according to claim 12 characterized in that facets are formed on the {210} plane and the {211} plane of the hexaboride.

14. The electron beam apparatus according to claim 12 characterized in that the {310} plane is formed with a pillar tip of the hexaboride that has been sharpened by electrolytic polishing, then field-evaporated and heated.

15. The electron beam apparatus according to claim 14 characterized in that the temperature for heating the hexaboride is 700° C. or higher and 1400° C. or lower.

* * * * *